(12) United States Patent
Cheung et al.

(10) Patent No.: US 7,312,146 B2
(45) Date of Patent: Dec. 25, 2007

(54) SEMICONDUCTOR DEVICE INTERCONNECT FABRICATING TECHNIQUES

(75) Inventors: Robin W. Cheung, Cupertino, CA (US); Ashok K. Sinha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

(21) Appl. No.: 10/945,664

(22) Filed: Sep. 21, 2004

(65) Prior Publication Data

US 2006/0063370 A1   Mar. 23, 2006

(51) Int. Cl.
*H01L 21/4763* (2006.01)

(52) U.S. Cl. .............. 438/638; 438/618; 438/672; 438/675; 438/678; 257/E21.579

(58) Field of Classification Search ........... 438/618, 438/638, 672, 678, 675, FOR. 355, FOR. 489; 257/E21.579
See application file for complete search history.

(56) References Cited

U.S. PATENT DOCUMENTS

| | | | |
|---|---|---|---|
| 6,054,379 A | 4/2000 | Yau et al. | 438/623 |
| 6,072,227 A | 6/2000 | Yau et al. | 257/642 |
| 6,090,697 A | 7/2000 | Xing et al. | 438/618 |
| 6,120,641 A | 9/2000 | Stevens et al. | 156/345 |
| 6,153,521 A | 11/2000 | Cheung et al. | 438/687 |
| 6,204,168 B1 | 3/2001 | Naik et al. | 438/638 |
| 6,259,160 B1 | 7/2001 | Lopatin et al. | 257/762 |
| 6,271,135 B1 | 8/2001 | Palmans et al. | 438/687 |
| 6,303,486 B1 | 10/2001 | Park | 438/618 |
| 6,309,975 B1 | 10/2001 | Wu et al. | 438/705 |
| 6,355,555 B1 | 3/2002 | Park | 438/634 |
| 6,376,374 B1 | 4/2002 | Stevens | 438/687 |
| 6,593,247 B1 | 7/2003 | Huang et al. | 438/758 |

(Continued)

OTHER PUBLICATIONS

Jun Li et al., Carbon Nanotube Interconnects: A Process Solution, NASA Ames Research Center, Moffiett Field, California (date unknown).

*Primary Examiner*—Michelle Estrada
(74) *Attorney, Agent, or Firm*—Law Office of Albert J. Dalhuisen

(57) ABSTRACT

The present invention provides methods for fabricating integrated circuit structures for use in semiconductor wafer fabrication techniques. A Cu diffusion barrier/Cu seed sandwich layer is deposited on a substrate. A first sacrificial layer, deposited on the sandwich layer, is developed to form a cavity. A first Cu layer is selectively deposited on the sandwich layer inside the cavity. A second sacrificial layer is deposited on the first sacrificial layer and on the first Cu layer. A cavity is formed in the second sacrificial layer, exposing at least a portion of the first Cu layer. A second Cu layer is selectively deposited in the second sacrificial layer cavity including the exposed portion of the first Cu layer. The combination of the first and second Cu layers forms a Cu component. Subsequently, the first and second sacrificial layers are removed resulting in a Cu component that is free standing on the sandwich layer, such that the top and sides of the component are exposed. Sandwich layer portions extending from the Cu component are removed from the substrate, thereby forming an exposed sandwich layer edge between the surface of the Cu component and the substrate. A Cu diffusion barrier layer is deposited on the Cu component and on the exposed edge of the sandwich layer, resulting in a Cu barrier layer encapsulated component. The encapsulated component is encased in a dielectric layer. Similarly, Cu components of the present invention are fabricated by means of selective electroless Cu deposition in a sacrificial layer cavity having a metal layer that is formed by selective electroless deposition of a metal on a sensitizer layer. Examples of Cu components and encapsulated Cu components of the present invention include vertical interconnects and inverted damascene structures.

31 Claims, 11 Drawing Sheets

U.S. PATENT DOCUMENTS

| | | |
|---|---|---|
| 6,867,125 B2 * | 3/2005 | Kloster et al. ............... 438/618 |
| 2002/0164544 A1 | 11/2002 | Luckanc et al. ............ 430/314 |
| 2003/0186535 A1 * | 10/2003 | Wong et al. ................. 438/637 |
| 2004/0058277 A1 * | 3/2004 | He et al. .................... 430/296 |

* cited by examiner

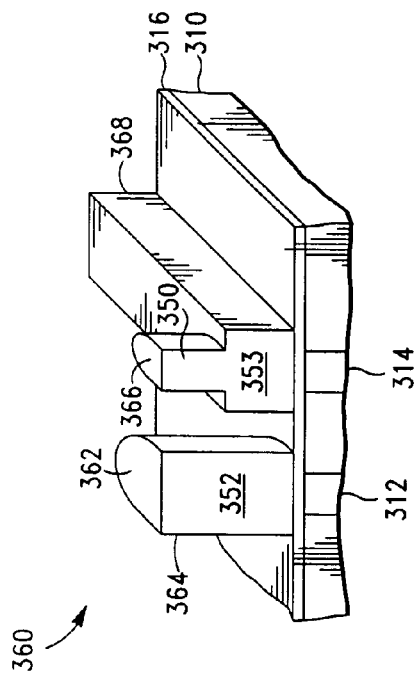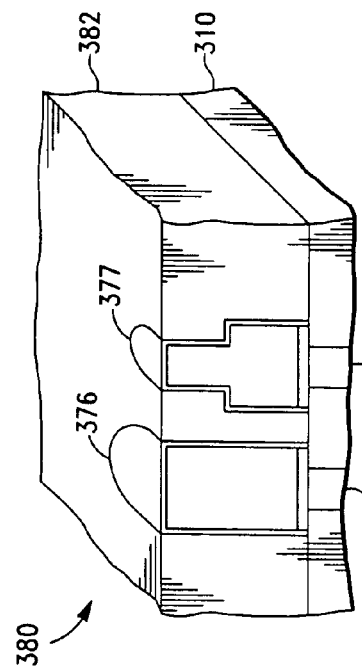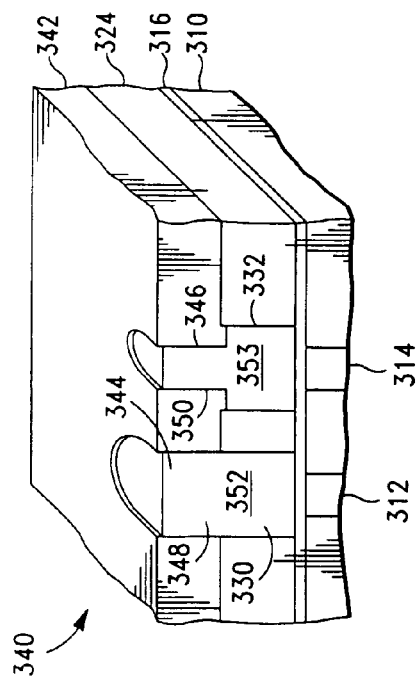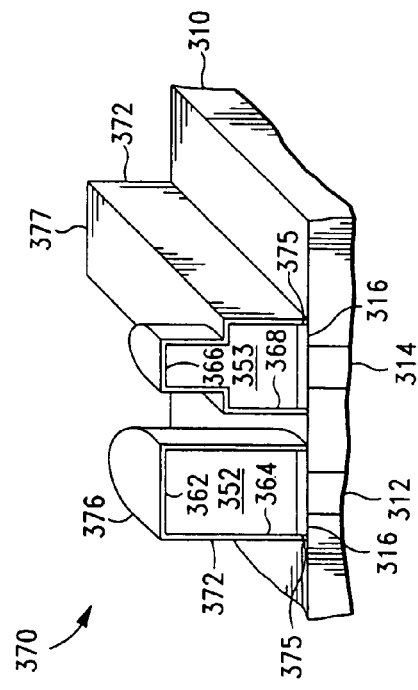

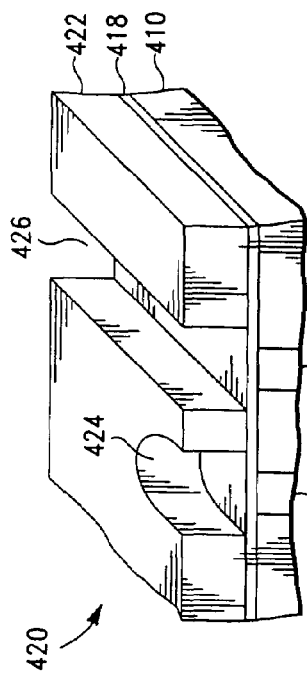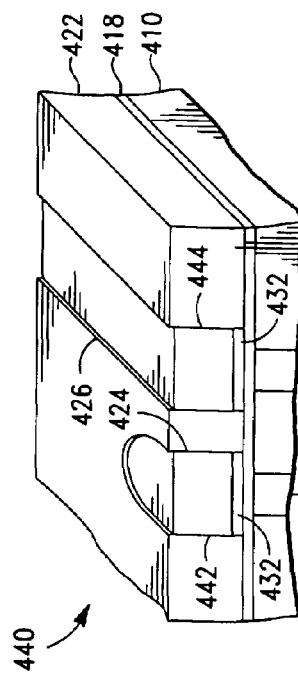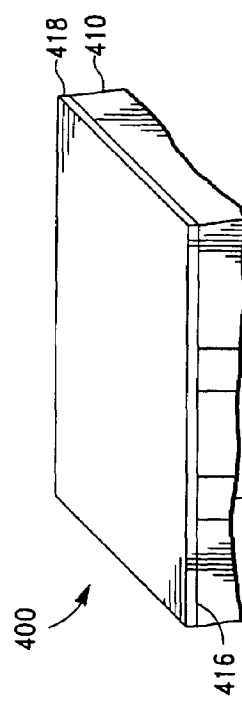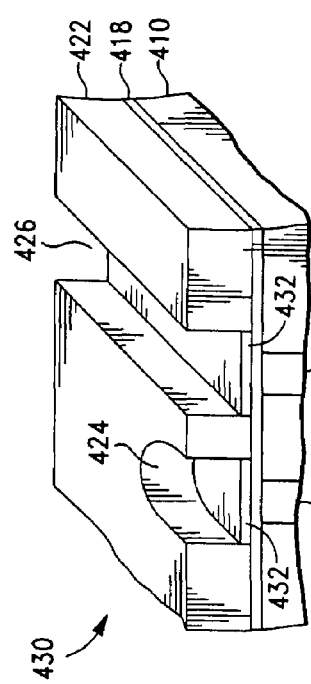

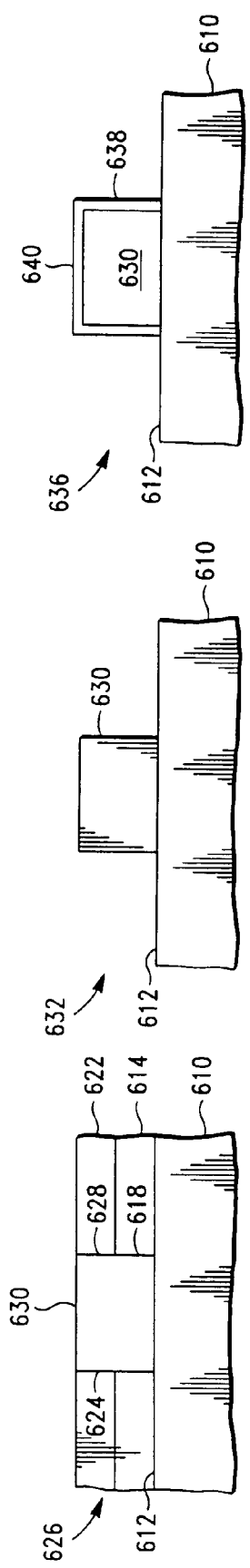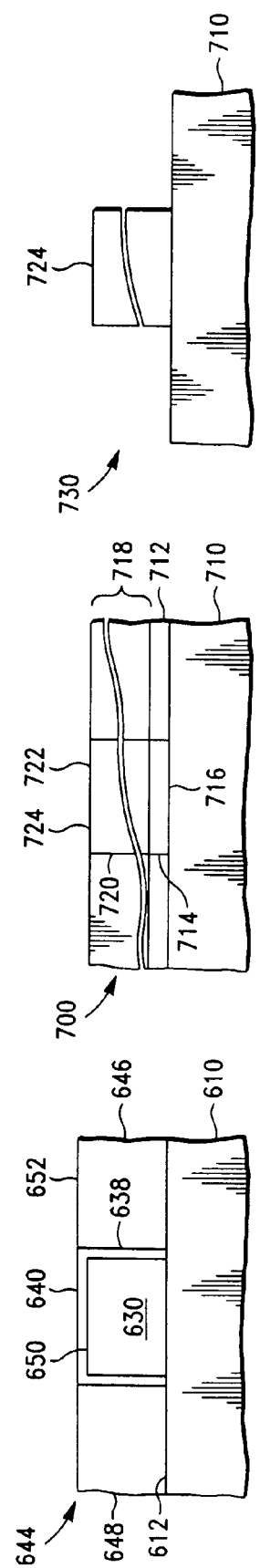

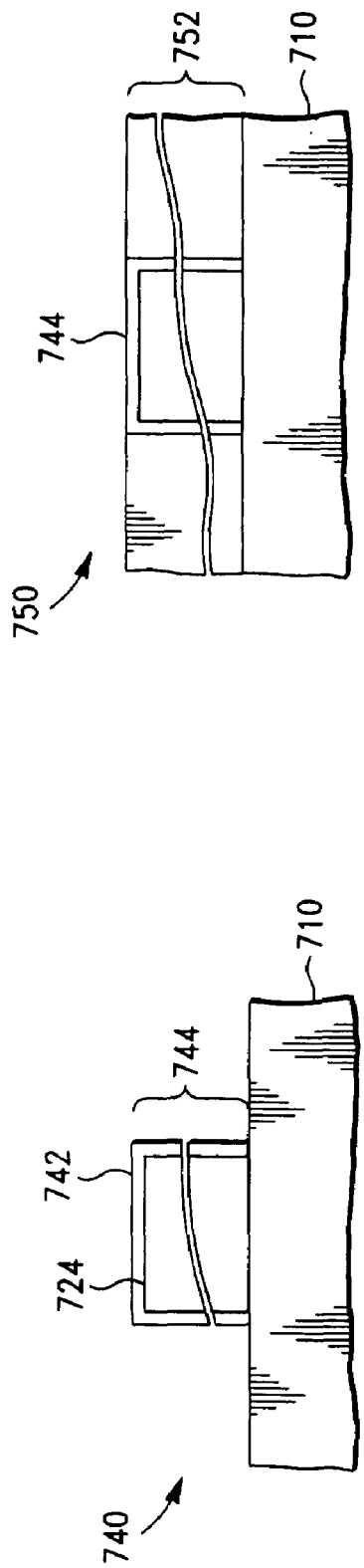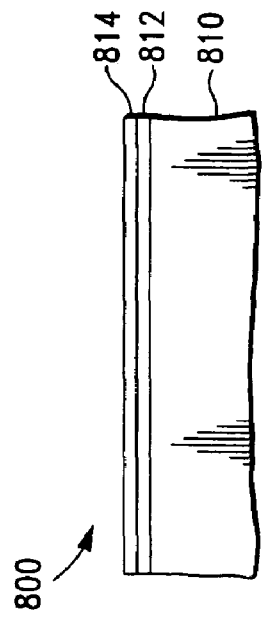

SEMICONDUCTOR DEVICE INTERCONNECT FABRICATING TECHNIQUES

FIELD OF THE INVENTION

The present invention relates to techniques for fabricating horizontal and vertical interconnects in the fabrication of semiconductor devices.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected trough conductive connectors to form a complete circuit which can contain millions of individual circuit elements. Advances in semiconductor materials and processing techniques have resulted in reducing the overall size of the IC circuit elements while increasing their number on a single body. Additional miniaturization is highly desirable for improved IC performance and cost reduction. Interconnects provide the electrical connections between the various electronic elements of an IC and they form the connections between these elements and the device's external contact elements, such as pins, for connecting the IC to other circuits. Typically, horizontal interconnects form horizontal connections between electronic circuit elements while vertical interconnects form vertical connections between the electronic circuit elements, resulting in layered connections. Horizontal interconnects are also referred to as interconnect lines, wires or traces, while vertical interconnects are also known as interconnect lines, vias, plugs or studs.

A variety of conventional techniques are employed for fabricating IC interconnects of semiconductor devices. For example a horizontal interconnect can be formed by etching a channel or trench in an insulating layer of a semiconductor device, using a variety of wet or dry etching techniques. The channel is then filled with a highly conductive material, such as for example copper, resulting in a horizontal interconnect. A layer having a horizontal interconnect line is typically known as a metal layer, while a layer that is disposed between two horizontal metal layers is commonly referred to as an intra metal layer or insulating layer. A vertical interconnect can similarly be formed by etching a hole through an insulating layer of a semiconductor device and then filling the hole with a highly conductive material resulting in a vertical interconnect line. It is a common practice in semiconductor wafer fabrication to form integrated circuits wherein a horizontal interconnect is formed on the exposed top surface of one or more vias or vertical interconnects. Similarly it is a conventional technique to from one or more vias or vertical interconnects on the exposed top surface of a horizontal interconnect. Generally, the layer in which the interconnect is formed remains, at least partly, in the finished semiconductor device. However, it is also known to remove the layer wherein the interconnect has been formed, and then replacing this layer with another material as shown in U.S. Pat. No. 6,153,521 (2000, Cheung et al.). The Cheung et al. patent teaches forming a horizontal interconnect line in a trench that is formed in a layer of sacrificial material. Following fabrication of the interconnect line in the trench, the sacrificial layer is removed thereby resulting in a free standing interconnect line. A conformal layer of conventional insulating material is then deposited on the interconnect line. The conformal layer is subjected to CMP (chemical mechanical polishing) to expose and define the interconnect line. As shown in the Cheung et al. patent, the line can be formed in contact with via plugs in an underlying insulating layer. Alternatively, the line can be formed by utilizing a sacrificial trench overlaying via holes, and then simultaneously filling the via holes and the trench with a metal. This technique of simultaneously filling a trench and underlying via hole is commonly known as dual damascene. The term "single damascene" is typically employed for techniques wherein the interconnect line and the underlying via are formed separately.

Lopatin et al. (U.S. Pat. No. 6,259,160, 2001) teach forming a via in a hole that is lined with a barrier layer to prevent metal diffusion into the insulating layer within which the via is formed. Subsequently, a metal interconnect line is formed in a trench overlaying the via, wherein the trench is formed in the sacrificial layer. The sacrificial layer is then removed, thus forming a free standing interconnect line which is subsequently encapsulated in a barrier layer. As a result, the Lopatin et al. via and interconnect line are encapsulated in a metal diffusion barrier layer. An insulating material is deposited on the interconnect line containing structure. A via hole can be prepared in the insulating layer such that the hole contacts the encapsulated interconnect line. One of the embodiments of U.S. Pat. No. 6,376,374 (Stevens, 2002) teaches depositing a barrier layer on a substrate and, if necessary, depositing a seed layer on the barrier layer. A metal interconnect line is formed in a trench of a first sacrificial layer that is deposited on the barrier layer or the barrier/seed layer. The first sacrificial layer is removed resulting in a free standing interconnect line. A second sacrificial layer is prepared on the interconnect line and on the barrier or barrier/seed layer. The second sacrificial layer is developed to form a via hole on the interconnect line, such that the via hole exposes a portion of the metal line. The via hole is then filled with metal to from a via plug, after which the second sacrificial layer is removed, thus resulting in a free standing structure comprising a via that is fabricated on a metal line. Thereafter, portions of the barrier or barrier/seed layer extending beyond the interconnect are removed. The top and sides of the resulting interconnect line and via structure are then partly or completed oxidized. Non-oxidized portions of the surface of the structure are subsequently coated with a barrier layer to impede metal migration from the line and/or via. A layer of insulating material is deposited on the oxidized and coated structure and on exposed segments of the substrate. The upper surface of the insulating layer is then treated to expose the top surface of the via that is fabricated on the interconnect line.

A need exists for improved fabricating techniques of structures, such as those exemplified in the above referenced patents, to improve IC device manufacturing yield, device reliability and manufacturing cost.

Copper, due to its low electrical resistance, is a preferred metal for IC interconnects. However, it is well known that copper components, such as deposits that are formed in a typical IC dielectric layer, are difficult to define when using CMP. For example, Cu surfaces tend to dish, i.e. forming a slightly hollow top surface, during CMP. It is therefore desirable to improve IC fabricating techniques in order to mitigate, or eliminate where possible, IC fabricating difficulties or inefficiencies resulting from the use of copper.

Furthermore, as a consequence of the well known need for increasing the circuit density, it is desirable to develop fabrication technologies that utilize etching and deposition openings that have a small diameter and a high aspect ratio.

SUMMARY OF THE INVENTION

In one embodiment of the present invention a Cu diffusion barrier/Cu seed sandwich layer is deposited on a semiconductor substrate. A first sacrificial layer is deposited on the substrate, after which a cavity is formed in the first sacrificial layer. A first Cu layer is selectively deposited in the cavity by means of ECP (electrochemical plating). A second sacrificial layer is deposited on the first sacrificial layer and on the first Cu layer. The second sacrificial layer is developed to form a cavity exposing at least a portion of the first Cu layer. Subsequently, a second ECP Cu layer is deposited in the second sacrificial layer cavity and on the exposed portion of the first Cu layer. The first and second sacrificial layers are then removed, resulting in a free standing Cu component including the first and second Cu layers. Examples of free standing Cu components of the present invention include inverted damascene structures and vertical interconnects.

In another embodiment of the present invention a Cu diffusion barrier/Cu seed sandwich layer is deposited on a semiconductor substrate. A first sacrificial layer is deposited on the substrate, after which a cavity is formed in the first sacrificial layer. A first Cu layer is selectively deposited in the cavity. A second sacrificial layer is deposited on the first sacrificial layer and on the first Cu layer. The second sacrificial layer is developed to form a cavity exposing at least a portion of the first Cu layer. Subsequently, a second Cu layer is deposited in the second sacrificial layer cavity and on the exposed portion of the first Cu layer. The first and second sacrificial layers are then removed, resulting in a free standing Cu component including the first and second Cu layers. Sandwich layer material extending from the Cu component, is removed from the substrate, resulting in an exposed edge of the sandwich layer, between the Cu component and the substrate. A Cu diffusion barrier layer coating comprising metal, is applied to the surface of the Cu component and the exposed edge of the barrier layer, thus forming a Cu containing component wherein Cu is encapsulated in a Cu diffusion barrier layer. The encapsulated component is then encased in a dielectric layer.

In an additional embodiment of the present invention an electrolytic deposition sensitizer layer such as Pd, also known as a catalytic layer, is deposited on the substrate. Thereafter, a first sacrificial layer is deposited on the sensitizer layer, after which a cavity is formed in the first sacrificial layer. A metal layer such as Ni or Co is then selectively deposited in the cavity using an electroless deposition method that employs the sensitizer layer. A first Cu layer is selectively deposited on the metal layer in the cavity by means of electroless Cu deposition. A second sacrificial layer is deposited on the first sacrificial layer and on the first Cu layer. The second sacrificial layer is developed to form a cavity exposing at least a portion of the first Cu layer. Subsequently, a second electroless Cu layer is selectively deposited in the second sacrificial layer cavity on the exposed portion of the first Cu layer. The first and second sacrificial layers are then removed, resulting in a free standing Cu component including the first and second Cu layers and the metal layer. Sensitizer layer material extending from the Cu component is removed from the substrate, resulting in an exposed edge of the sensitizer layer. The free standing Cu component and the underlying edge of the sensitizer layer can then be encapsulated in a Cu diffusion barrier layer and subsequently encased in a dielectric layer. The metal layer comprising for example Ni or Co provides a nucleating surface to initiate deposition of electroless Cu deposition as well as a Cu diffusion barrier.

In still another embodiment of the present invention a Cu component having a height H, such as a horizontal interconnect, is fabricated on a substrate. A first sacrificial layer is deposited on the substrate, wherein the sacrificial layer has a thickness T1 such that T1<H. A cavity extending to the substrate is formed in the first sacrificial layer. A first Cu layer is deposited in the cavity. Subsequently, a second sacrificial layer is deposited on the first sacrificial layer and on the first Cu layer, wherein the second sacrificial layer has a thickness T2 such that T1+T2 is at least equal to H. A cavity is formed in the first sacrificial layer such that the cavity includes at least a portion of the surface of the second Cu layer. A second Cu layer is deposited in the second sacrificial layer cavity including the exposed portion of the first Cu layer. The thickness of the second Cu layer is such that the combined thickness of the first and second Cu layers is substantially equal to H. The Cu component comprising the first and second Cu layers therefore has a height that is substantially equal to H.

BRIEF DESCRIPTION OF THE DRAWINGS

FIGS. 3A-3E are schematic cross-sectional perspective views illustrating an embodiment of IC structures of the present invention at sequential stages.

FIGS. 4A-4I are schematic cross-sectional perspective views illustrating an embodiment of IC structures of the present invention at sequential stages.

FIGS. 6A-6F are schematic cross-sectional views illustrating an embodiment of IC structures of the present invention at sequential stages.

FIGS. 7A-7D are schematic cross-sectional views illustrating an embodiment of IC structures of the present invention at sequential stages.

FIG. 8 is a schematic cross-sectional view illustrating a semiconductor substrate suitable for IC structures of the present invention.

DETAILED DESCRIPTION OF THE INVENTION

While describing the invention and its embodiments, certain terminology will be utilized for the sake of clarity. It is intended that such terminology includes the recited embodiments as well as all equivalents.

One embodiment, schematically illustrated in FIGS. 1A-1K, shows a novel processing sequence for forming IC structures including a vertical interconnect line and an inverted damascene structure. The expression "integrated circuit structure" as defined herein, means completely formed integrated circuits and partially formed integrated circuits. The expression "inverted damascene structure" means an integrated circuit structure comprising a horizontal interconnect line upon which one or more vias are fabricated.

Figure 1A:
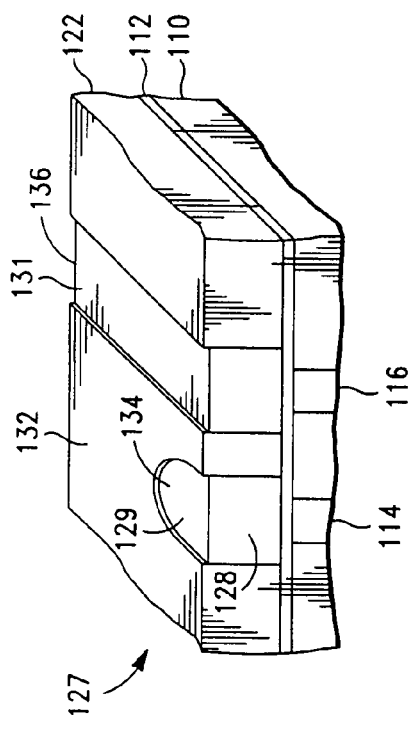
FIGS. 1A-1K are schematic cross-sectional perspective views illustrating an embodiment of IC structures of the present invention at sequential stages.

FIG. 1A shows an IC structure 100 including electrically conductive barrier/seed sandwich layer 112 that is deposited on a substrate, such as a semiconductor substrate 110. The expression "semiconductor substrate" as defined herein, means structures and devices comprising typical IC elements, components, interconnects and semiconductor materials. Electrically conductive elements 114 and 116, positioned in substrate 110, provide electrically conductive contacts with IC elements of the substrate. Barrier/seed sandwich layer 112 comprises an electrically conductive conventional Cu diffusion barrier layer 118, deposited on top surface 119 of substrate 110 and contacting the top surfaces of conductive elements 114 and 116, and an electrically conductive conventional Cu seed layer 120 that is deposited on barrier layer 118, see FIG. 1A. Typical Cu diffusion barrier materials include, but are not limited to, conductors for example refractory metals such as Ta, Ti, TiW and compounds of refractory metals such as TiN, TiC, TaN and TaC, as well as combinations of these materials such as TaN/Ta and Ti/TaN/Ta. Typical seed layer materials for Cu seed layer 120 include Cu and Cu alloys with a low percentage of one or more other metals. Suitable techniques for depositing barrier/seed sandwich layer 112 are known to those of ordinary skill in the art. As shown in FIG. 1A, a first sacrificial layer 122, comprising a lithography definable material, is deposited on barrier/seed sandwich layer 112. The expression "lithography definable material" as defined herein, means material that, upon exposure to radiation including light, x-rays or e-beam (electron-beam) electrons and subsequent development, are capable of forming a three dimensional IC fabrication pattern such as an etch or metal deposition pattern. Employing conventional lithographic techniques, a first through hole 124 is formed in first sacrificial layer 122, such that hole 124 is aligned with conductive element 114 of semiconductor substrate 110. Similarly, a horizontal interconnect trench 126 is prepared in first sacrificial layer 122, such that the trench is aligned with conductive element 116. First through hole 124 and trench 126 are generally designated as cavities.

Figure 1B:
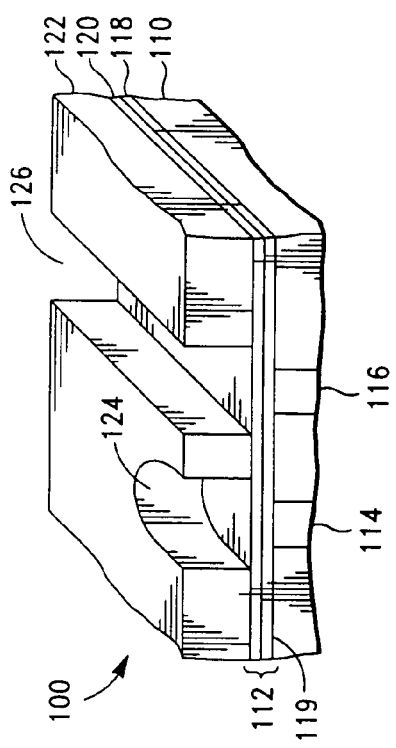

As illustrated in IC structure 127 shown in FIG. 1B, Cu is selectively deposited in the first through hole and in the trench, thereby forming first Cu plug 128 and Cu horizontal interconnect 130 respectively. Conventional ECP (electrochemical plating) Cu deposition methods and materials are employed in forming Cu first plug 128 and Cu interconnect 130. The Cu seed layer of barrier/seed layer 112 is utilized as the cathode for the ECP deposition technique, resulting in Cu deposition in the first through hole and in the trench. Cu deposition in the first through hole and in the trench is selective to the first sacrificial layer. Preferably, Cu deposition is stopped when the top surface 129 of plug 128 and top surface 131 of interconnect 130 are slightly below top surface 132 of first sacrificial layer 122. For example, filling the first through hole and the trench to approximately 90% of the depth of the hole and the trench. The partial filling of the first through hole and the trench results in an unfilled top portion 134 of the first through hole, and an unfilled top portion 136 of the trench, see FIG. 1B. Partial filling of the first through hole and the trench is utilized to obtain optimized plug and interconnect definition without forming Cu on top surface 132 of first sacrificial layer 122, such as can occur when the through hole and/or the trench are overfilled with Cu, and therefore not requiring a procedure such as CMP to define the plug and the horizontal interconnect. A suitable ECP process for embodiments of the present invention is described in U.S. Pat. No. 6,258,223 (Cheung et al., 2001). Commonly assigned U.S. Pat. No. 6,258,223 is herein incorporated by reference in its entirety.

Figure 1C:
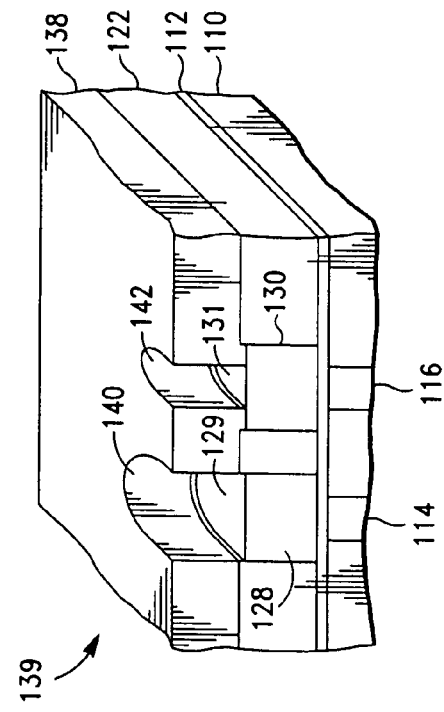
Figure 1D:
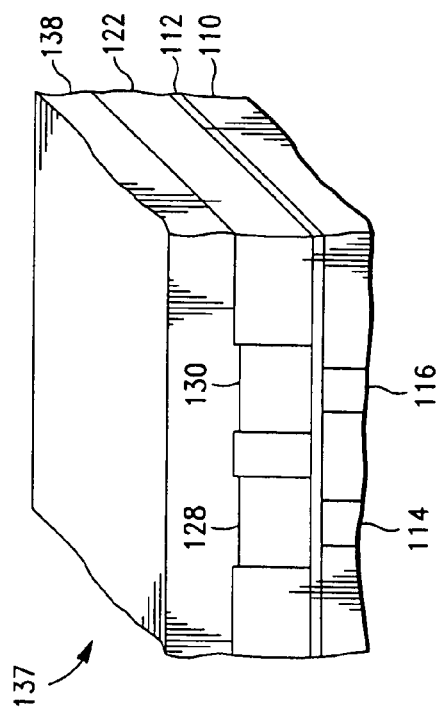

With reference to FIG. 1C showing a novel IC structure 137, in a novel procedure of the present invention a second sacrificial layer 138 is deposited on first sacrificial layer 122 and on Cu first plug 128 and Cu interconnect 130. Second sacrificial layer 138 thus fills top portions 134 and 136 (FIG. 1B) of the first through hole and the trench respectively. A second through hole 140, depicted in FIG. 1D showing an IC structure 139 of the present invention, is formed in second sacrificial layer 138 extending to the surface of first plug 128, such that the second through hole is aligned with this underlying Cu plug, thereby exposing top surface 129 of first Cu plug 128. Similarly, a via hole 142 is formed in second sacrificial layer 138 such that the via hole extends to top surface 131 of interconnect line 130. Via hole 142, thus extends through second sacrificial material that was deposited in top portion 136 (FIG. 1B) of interconnect trench 126.

A wide variety of materials is suitable for first and second sacrificial layers 122 (FIGS. 1A-1E) and 138 (FIGS. 1C-1E) respectively which can be used in the novel procedures of the present invention. Examples of suitable materials for use in the first and/or second sacrificial layers include lithography definable materials, SLAM (sacrificial light absorbing material), inorganic dielectric materials and organic dielectric materials. Examples of suitable lithography definable materials for use in the first and/or second sacrificial layers of the present invention include positive photoresists and negative photoresists, for example phenol formaldehyde novolac/naphthoquinone diazide and cyclized polyisoprene polymer/benzene respectively. Suitable photoresist materials also include silicon-based photoresist materials such as disclosed in U.S. Pat. No. 6,204,168 (Naik et al., 2001). Commonly assigned U.S. Pat. No. 6,204,168 is herein incorporated by reference in its entirety. Examples of suitable SLAM materials include SOG (spin-on-glass) and SOP (spin-on-polymer).

Methods and materials of the present invention include embodiments wherein (1) the first sacrificial layer comprises the same materials or products as the second sacrificial layer, such as utilizing the same photoresist material in both sacrificial layers, or (2) the materials or products for use in the first sacrificial layer are different from those in the second sacrificial layer, such as employing an SOP in the first sacrificial layer and an organic photoresist in the second sacrificial layer. It will be understood that cavities in sacrificial layers, such as through hole 124 and trench 126 (FIG. 1A), can be fabricated utilizing a variety of conventional techniques. For example, where the sacrificial layer comprises a lithograph definable material such as a photoresist, the cavity can be fabricated through conventional exposure of the layer of lithography definable material, followed by development of the exposed layer, to form the cavity. Where the sacrificial layer comprises a material that does not have lithography definable properties, such as SLAM, a conventional etch mask is formed on the layer, after which the etch mask is utilized in a conventional manner to etch the cavity in the sacrificial layer.

Figure 1E:
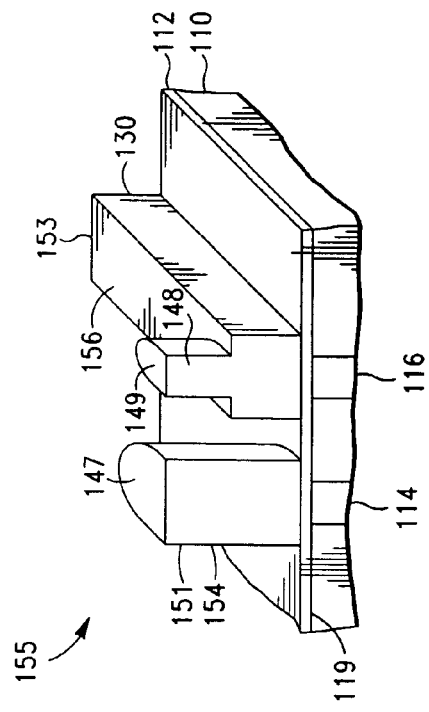

Conventional ECP Cu deposition methods and materials are employed to selectively deposit a second Cu plug 146, see FIG. 1E, in the second through hole such that second Cu plug 146 is fabricated on first Cu plug 128. Similarly, a via 148 is selectively deposited in the via hole, see FIG. 1E showing IC structure 145, following procedures similar to those that are employed for forming first plug 128 and interconnect 136 shown in FIG. 1B. Returning to FIG. 1E, the second through hole and the via hole are preferably slightly underfilled, resulting in unfilled top portions 150 and 152 respectively, and exposed Cu top surfaces 147 and 149 respectively. Plugs 128 and 146 form a vertical interconnect line 154, while interconnect line 130 and via 148 form a inverted damascene structure 156. The term "vertical" as used herein, means substantially perpendicular to top surface 119 of substrate 110.

Figure 1F:
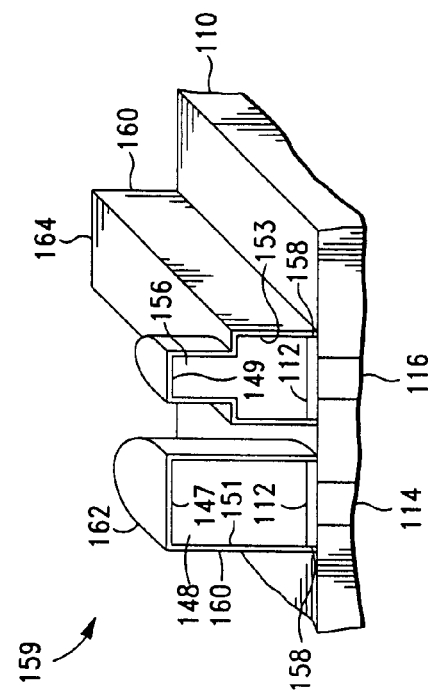
Figure 1G:
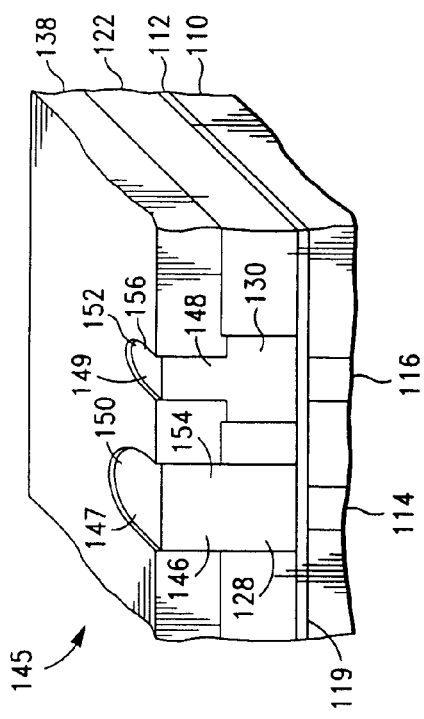

FIG. 1F depicts an IC structure 155 that is obtained through removal of the first and second sacrificial layers of IC structure 145, employing such sacrificial layer removal methods as are known to a person of ordinary skill in the art. IC structure 155 comprises vertical interconnect 154 and inverted damascene structure 156 that are both fabricated on barrier/seed layer 112. Vertical interconnect 154 includes exposed top Cu surface 147 and exposed Cu surface 151 extending between top Cu surface 147 and barrier/seed sandwich layer 112. Inverted damascene structure 156 includes exposed via top Cu surface 149 and exposed Cu surface 153 extending between top Cu via surface 149 and barrier/seed sandwich layer 112. Each of the free standing structures illustrated in FIG. 1F thus includes an exposed Cu surface comprising (1) the exposed top Cu surface and (2) the exposed Cu surface extending between the top Cu surface and the barrier/seed layer. Conductive barrier/seed layer 112 provides an electrical contact between vertical interconnect 154 and conductive element 114 of substrate 110, as well as between inverted damascene structure 156 and conductive element 116. The term "horizontal" as used herein, means substantially parallel to surface 119 of substrate 110. Vertical interconnect 154 and inverted damascene structure 156 are fabricated in a vertical position. Conventional anisotropic etching procedures and materials are subsequently employed to subtractively etch exposed barrier/seed layer 112, to remove barrier/seed layer materials that extends beyond vertical interconnect 154 and inverted damascene structure 156, as depicted in FIG. 1G showing IC structure 157. The etching procedure results in exposed side edges 158 of barrier/seed layer 112 that is sandwiched between substrate 110 and the vertical interconnect as well as the inverted damascene structure. Alternatively, conventional electropolishing techniques can be employed to remove barrier/seed layer 112 down to top surface 119 of substrate 110. The expression "inverted damascene structure" as defined herein, means an interconnect structure wherein a via is fabricated on a horizontal interconnect.

Figure 1H:
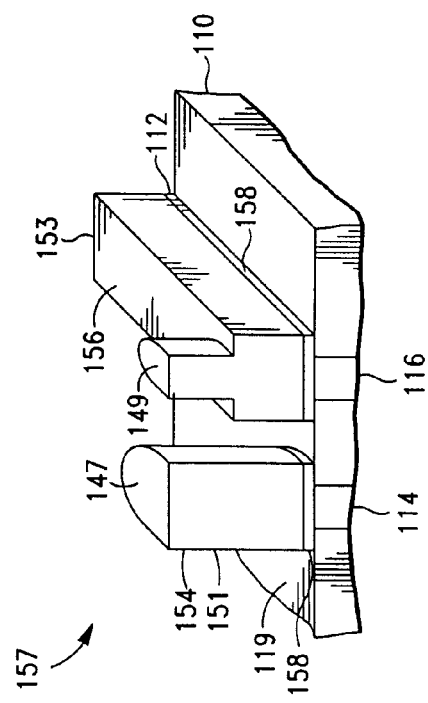

Utilizing techniques that are known to a person of ordinary skill in the art, a conventional Cu diffusion barrier layer 160 is deposited on top Cu surface 147 and on extended Cu surface 151 of vertical interconnect 154, as well as on top Cu surface 149 of via 148 and on extended Cu surface 153 of inverted damascene structure 156, as illustrated in IC structure 159 depicted in FIG. 1H. Additionally, barrier layer 160 covers exposed side edges 158 of barrier/seed layer 112. The techniques illustrated in FIG. 1H provide a vertical interconnect 162 and a inverted damascene structure 164 wherein Cu is completely encapsulated in the Cu diffusion barrier layer. Suitable materials for Cu diffusion barrier layer 160 includes conductors such as enumerated in connection with barrier layer 118, shown in FIG. 1A, as well as insulators described in connection with Cu diffusion barrier layer 180, depicted in FIG. 1K. Alternatively, in one embodiment of the present invention barrier layer 160 comprises CoWP (cobalt tungsten phosphide). CoWP can be deposited on the Cu structures employing an electroless process such as is known to persons of ordinary skill in the art, see for example the 6,259,160 patent. Upon subsequent heat treatment, the CoWP layer forms a passivation layer thus combining the desired Cu diffusion barrier function with a passsivation layer function.

Figure 1J:
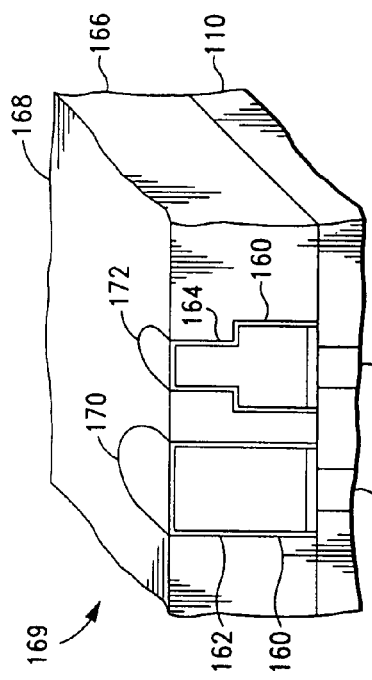
Figure 1I:
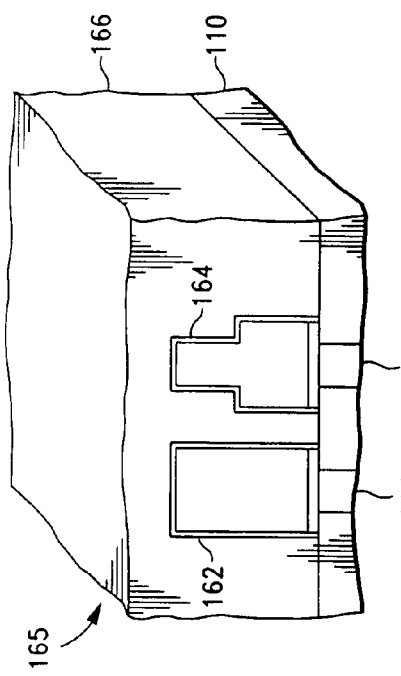
Figure 1K:
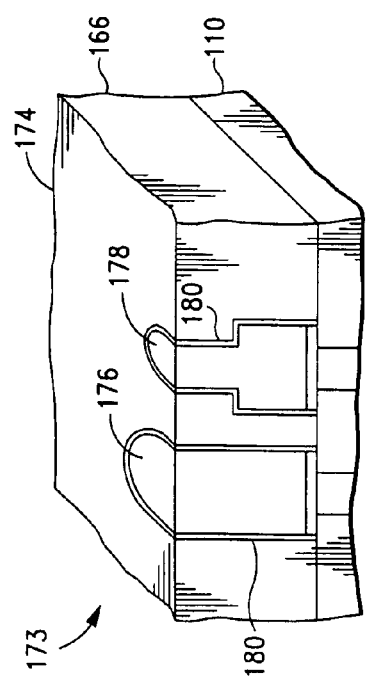

With reference to FIG. 1I showing IC structure 165, a dielectric layer 166 is deposited on IC structure 159 depicted in FIG. 1H. Returning to FIG. 1I, employing conventional methods and materials, vertical interconnect 162 and inverted damascene structure 164 are encased in dielectric layer 166 such that there are no voids between the vertical interconnect and the inverted damascene structure. In a next processing step, shown in FIG. 1J illustrating IC structure 169, dielectric layer 166 is subjected to a conventional etch back procedure or conventional CMP (chemical mechanical polishing) to provide a planar top surface 168 of the dielectric layer and to define top surfaces 170 and 172 of vertical interconnect 162 and inverted damascene structure 164 respectively, such that top surfaces 168, 170 and 172 are substantially coplanar. Conventional techniques are employed to fabricate top surfaces 168, 170 and 172 such that these top surfaces are substantially coplanar. Alternatively, etch back and/or CMP techniques can be utilized to provide a planar top surface 174 of layer 166, see FIG. 1K showing IC structure 173, such that the barrier layer is removed from the top of the vertical interconnect and inverted damascene structure, exposing Cu top surfaces 176 and 178 of the vertical interconnect and the inverted damascene structure respectively, such that top surfaces 174, 176 and 178 are substantially coplanar. The exposed top surfaces of the vertical interconnect and the inverted damascene structure, illustrated in FIGS. 1J and 1K, are designed to provide electrically conductive contacts with IC elements of a subsequent IC layer. Where barrier layer 160 comprises electrically conductive materials, top surfaces 170 and 172 (FIG. 1J) are suitable for providing electrically conductive contacts with conductive components in a subsequent IC layer. Where a non-conducting barrier layer 180 (FIG. 1K) is used for encapsulation of the vertical interconnect line and the inverted damascene structure, barrier layer 180 can be removed, using for example conventional etch back or CMP, from the top surface of the interconnect line and the inverted damascene structure in order to provide conductive Cu surfaces 176 and 178. Suitable insulators for non-conducting barrier layer 180 include, but are not limited to, $Si_3N_4$, $SiON_x$, SiC, SiCN, amorphous cabon and spin-on-materials, e.g. divinyl siloxane benzocyclobutane. Alternatively, non-conducting barrier layers that provide the top surface of a vertical interconnect or an inverted damascene structure can be opened by means of a conventional etching step.

Suitable dielectric materials for dielectric layer 166 (FIG. 1I) typically include silicon oxide. The expression "silicon oxide" as defined herein, includes $SiO_2$, related non-stoichiometric materials $SiO_x$. Related silica glasses include USG (undoped silica glass), FSG (fluorinated silica glass), borophosphosilicate glass (BPSG) and C-doped silicon oxide. The expressions: "silicon oxide", "related non-stoichiometric materials $SiO_x$" and "related dielectric silica glasses", as defined herein, exclude C-doped silicon oxide. These dielectric materials suitable for use in dielectric layer 166 have a low dielectric constant. Additionally other low dielectric constant materials are suitable for use in layer 166, for example amorphous fluorinated carbon based materials, spin-on dielectric polymers such as fluorinated and non-fluorinated poly(arylene) ethers (commercially known as FLARE 1.0 and 2.0, which are available from Allied Signal Company), poly(arylene) ethers (commercially known as PAE 2-3, available from Schumacher Company), divinyl siloxane benzocyclobutane (DVS-BCB) or similar products and aero-gel.

Figure 2A:
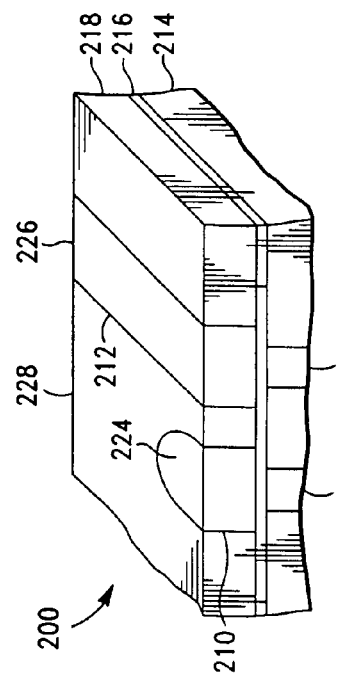
FIGS. 2A-2D are schematic cross-sectional perspective views illustrating an embodiment of IC structures of the present invention at sequential stages.

Embodiments of the present invention preferably utilize Cu components such as plugs, interconnect lines and vias that are fabricated by underfilling the sacrificial layer cavities wherein these Cu components are formed, as illustrated for example in FIGS. 1B and 1E. However, it is also contemplated within the scope of the invention to utilize methods and materials wherein these Cu components are fabricated such that the top surface of each of these components is substantially level with the top surface of the sacrificial layer wherein the Cu components are formed, as illustrated and described in connection with FIGS. 2A-2D. An IC structure such as IC structure 100 depicted in FIG. A1 is prepared. Subsequently, as illustrated in FIG. 2A showing IC structure 200, Cu is selectively deposited in the cavities to form a first Cu plug 210 and a horizontal Cu interconnect 212. Semiconductor substrate 214, electrically conductive barrier/seed sandwich layer 216, first sacrificial layer 218, conductive elements 220 and 222 shown in FIG. 2A are similar to features 110, 112, 122, 114 and 116 respectively, shown in FIG. 1A. With reference to FIG. 2A, the deposition materials and methods for fabricating first Cu plug 210 and horizontal interconnect 212 are similar to those described in connection with Cu plug 128 and horizontal interconnect 130 depicted in FIG. 1B, except that top surface 224 of first plug 210 (FIG. 2A) and top surface 226 of horizontal interconnect 212 are substantially coplanar with top surface 228 of first sacrificial layer 218, as depicted in FIG. 2A.

With reference to FIG. 2A, conventional methods are utilized to obtain top Cu surfaces 224 and 226 of the first Cu plug and the horizontal interconnect respectively that are substantially coplanar with top surface 228 of first sacrificial layer 218. These methods include selective ECP Cu deposition that is controlled to achieve the desired thickness of the Cu deposits. Alternatively, the cavities can be overfilled with Cu, followed by etch back, CMP or electropolishing to remove excess Cu.

Figure 2C:
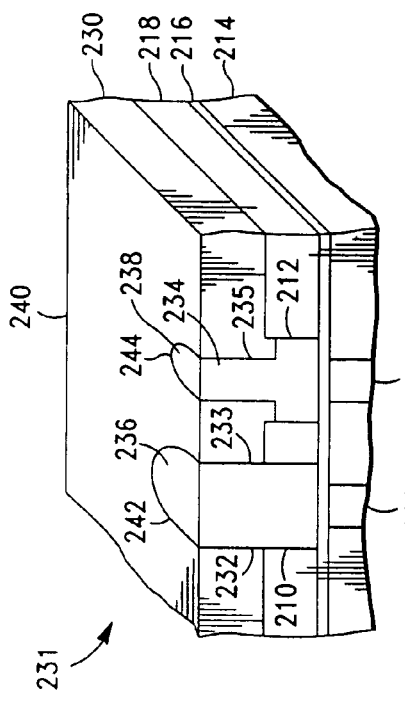
Figure 2B:
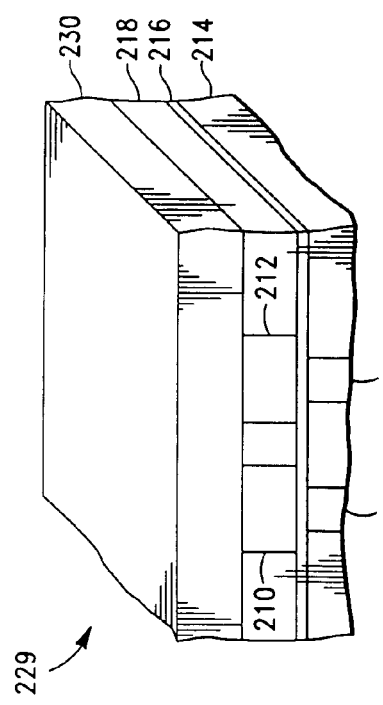

In a procedure of the present invention, a second sacrificial layer 230 is deposited on IC structure 200 shown in FIG. 2A, thereby forming IC structure 229 depicted in FIG. 2B. The materials and methods for depositing second sacrificial layer 230 are similar to those described in connection with second sacrificial layer 138, shown in FIG. 1C. With reference to FIG. 2C showing novel IC structure 231, second sacrificial layer 230 is developed to form cavities 232 and 234 such as second through hole 140 and via hole 142 shown in FIG. 1D. In a next processing step, depicted in FIG. 2C, Cu is selectively deposited in the cavities of the second sacrificial layer, using ECP, to form second Cu plug 233 on first plug 210 and to form via 235 on horizontal interconnect 212, using materials and techniques similar to those employed for forming second plug 146 and via 148 shown in FIG. 1E. With reference to FIG. 2C, top surface 236 of second Cu plug 233 and top surface 238 of via 235 are fabricated such that these top surfaces are substantially coplanar with top surface 240 of second sacrificial layer 230, using techniques similar to those described in connection with Cu top surfaces 224 and 226 (FIG. 2A). First and second plugs 210 and 233, shown in FIG. 2C, form a vertical Cu interconnect 242 while via 235 and horizontal interconnect 212 form an inverted damascene structure 244.

Figure 2D:
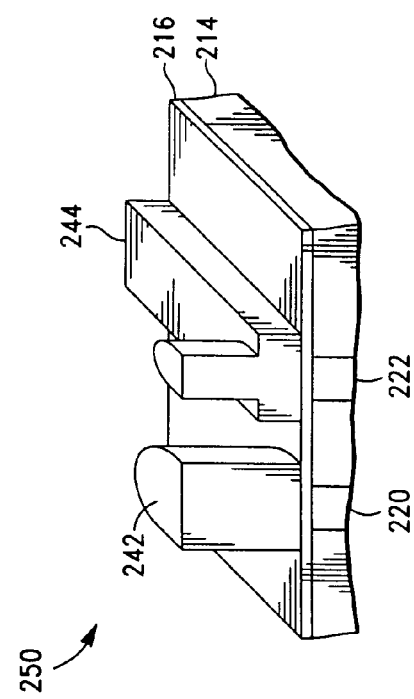

Subsequently, the first and second sacrificial layers are removed, as illustrated in FIG. 2D depicting IC structure 250, resulting in free standing structures of vertical interconnect 242 and inverted damascene structure 244. These structures are similar to the free standing vertical interconnect and inverted damascene structure shown in FIG. 1F. Barrier/seed layer 216 is removed from substrate 214 where these materials extend beyond vertical interconnect 242 and inverted damascene structure 244, resulting in an IC structure that is similar to IC structure 157 shown in FIG. 1G. A conventional Cu diffusion barrier layer is then deposited on the exposed Cu surfaces of the vertical interconnect and the inverted damascene structure as well as on the exposed side edges of the barrier/seed layer similar to the description and illustration of FIG. 1H. Cu that is present in the vertical interconnect and the inverted damascene structure is thus completely encapsulated in the Cu diffusion barrier layer. A suitable dielectric material is subsequently deposited on the encapsulated structures, as described and shown in connection with FIG. 1I, to form a dielectric layer such that there are no voids between the encapsulated structures. Conventional etch back or CMP is employed to fabricate structures similar to IC structures 169 and 173 depicted in FIGS. 1J and 1K, respectively.

Figure 3A:
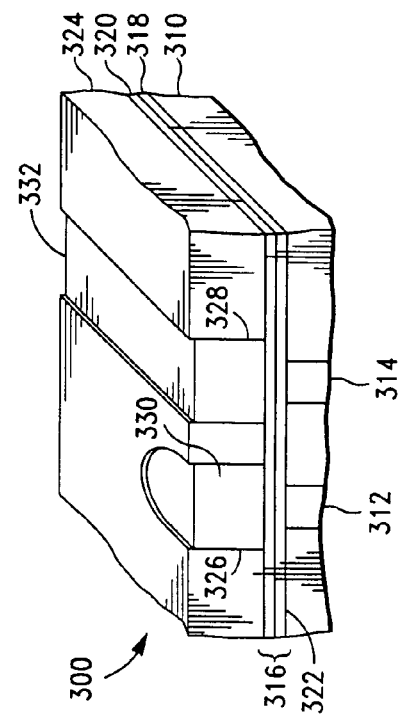

In another embodiment of the present invention a vertical Cu interconnect and an inverted damascene structure are prepared wherein Cu is selectively deposited through an electroless Cu deposition process as illustrated in FIGS. 3A-3E. With reference to FIG. 3A an IC structure 300 is formed that includes substrate 310 having electrically conductive elements 312 and 314. An electrically conductive barrier/seed sandwich layer 316 comprising Cu diffusion barrier layer 318 and Cu seed layer 320 is deposited on top surface 322 of substrate 310 and conductive elements 312 and 314, such that the Cu diffusion barrier layer contacts surface 322. Features 310, 312, 314, 316, 318, 320 and 322 shown in FIG. 3A are similar to features 110, 114, 116, 112, 118, 120 and 119 depicted in FIG. 1A. Subsequently, as illustrated in FIG. 3A, a first sacrificial layer 324 is deposited on barrier/seed sandwich layer 316. A first through hole 326 and horizontal trench 328 are prepared in the first sacrificial layer such that features 324, 326 and 328 illustrated in FIG. 3A are similar to features 122, 124 and 126 depicted in FIG. 1A.

Additionally, with reference to FIG. 3A, in a novel procedure of the present invention electroless Cu is selectively deposited in first through hole 326 and in trench 328, thereby forming a first Cu plug 330 in the first through hole and a horizontal Cu interconnect 332 in the trench. First plug 330 and an interconnect 332 are preferably fabricated such that the first through hole and the trench are slightly underfilled, similar to the preferred underfilling of first through hole 124 and trench 126, as described in connection with FIG. 1B. As illustrated in FIG. 3B, depicting IC circuit 340, a second sacrificial layer 342 is deposited on IC structure 300 shown in FIG. 3A. A second through hole 344, see FIG. 3B, and a via hole 346 are formed in second sacrificial layer 342, similar to the preparation of second through hole 140 and via hole 142 depicted in FIG. 1D. With reference to FIG. 3B, second through hole 344 and via hole 346 are then slightly underfilled with Cu by means of electroless Cu deposition, thereby forming a second Cu plug 348 and a via 350. This novel process results in forming a vertical Cu interconnect 352 comprising first Cu plug 330 and second Cu plug 348. An inverted damascene structure 353 comprising horizontal interconnect 332 and via 350 is also fabricated by means of this technique. Suitable techniques and materials for electroless deposition of Cu in embodiments of the present invention are disclosed in the U.S. Pat. No. 6,258,233 patent. First and second sacrificial layers 324 and 342 respectively comprise materials similar to first and second sacrificial layers 122 and 138 respectively depicted in FIG. 1E.

As shown in FIG. 3C depicting IC circuit 360, the first and second sacrificial layers are removed in a continuation of the novel methods of the present invention, thereby forming a free standing vertical interconnect 352 and a free standing inverted damascene structure 350. The free standing vertical interconnect 352 includes exposed top Cu surface 362 and exposed Cu surface 364 extending between top Cu surface 362 and barrier/seed layer 316. Similarly, free standing inverted damascene structure 350 includes exposed top Cu surface 366 of via 350 and exposed Cu surface 368 extending between top Cu surface 366 and barrier/seed layer 316. Each of the free standing structures illustrated in FIG. 3C thus includes an exposed Cu surface comprising the exposed top Cu surface 366 and (2) the exposed Cu surface 368 extending between the top Cu surface and the seed/barrier layer. IC structure 370, shown in FIG. 3D, is then fabricated by utilizing methods and materials such as described in connection with FIGS. 1G and 1H, including the removal of barrier/seed layer 316 from substrate 310 where the sandwich layer extends beyond vertical interconnect 352 and beyond inverted damascene structure 350. A conventional Cu diffusion barrier layer 372 is then deposited on Cu surfaces 362 and 364 of the vertical interconnect and on Cu surfaces 366 and 368 of the inverted damascene structure, as well as on the exposed side edges 375 of the sandwich layer underlying vertical interconnect 352 and inverted damascene structure 350. This process results in a free standing vertical interconnect 376 and a free standing inverted damascene structure 377 that are encapsulated in Cu diffusion barrier layer material. Subsequently, the vertical interconnect and the inverted damascene structure are encased in a dielectric layer, employing techniques such as described and illustrated in connection with FIG. 1I. Thereafter, the encased structure is planarized resulting in IC structure 380, shown in FIG. 3E, depicting dielectric layer 382 including encapsulated vertical interconnect 376 and encapsulated inverted damascene structure 377.

In a further embodiment of the present invention, the selective electroless Cu deposition techniques of the present invention, can be utilized to completely fill through holes, trenches and via holes of embodiments of the present invention, such as described and illustrated in connection with FIGS. 3A and 3B, resulting in structures similar to those illustrated and described in connection with FIGS. 2A-2B.

Figure 4E:
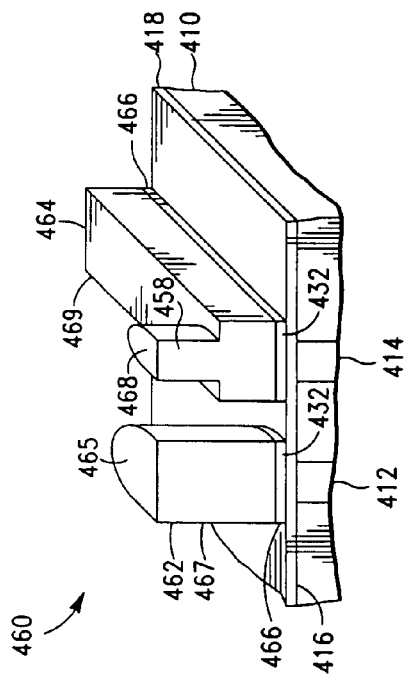

In yet another embodiment of the present invention, illustrated in FIGS. 4A-4I, electroless Cu is selectively deposited on a layer of a metal such as Ni or Co and their alloys wherein this metal layer is deposited by means of an electroless plating technique. As shown in FIG. 4A, an IC circuit 400 is formed that includes a substrate 410 having conductive elements 412 and 414. The substrate and conductive elements also include a top surface 416. A conventional sensitizer layer 418, also known as a catalytic layer and as a seed layer, is deposited on top surface 416. Sensitizer layer 418, comprising a first metal layer, is prepared to induce electroless deposition of metals such as Ni or Co, from a solution of these metals. Sensitizer solutions or colloidal suspensions containing for example Pd, Pt, Ru, Rh, Os, Ir, Sn or their alloys are commonly utilized to deposit a sensitizer layer including a metal such as Pd, Pt, Ru, Rh, Os, Ir, Sn and their alloys. It is also known to deposit these catalyzing metals by means of sputtering. Suitable metals for sensitizer layer 418 include Pd, Pt, Ru, Rh, Os, Ir, Sn and their alloys. Pd comprises a preferred metal for sensitizer layer 418.

With reference to FIG. 4B, a novel IC structure 420 is formed employing novel procedures of the present invention wherein a first sacrificial layer 422 is deposited on sensitizer layer 418. A first through hole 424 is fabricated in layer 422 such that through hole 424 is aligned with conductive element 412. Similarly, a trench 426 that is aligned with conductive element 414 is formed in first sacrificial layer 422. Then, as shown in FIG. 4C depicting IC structure 430, a second metal layer 432, preferably comprising Ni or Co is selectively deposited on sensitizer layer 418 in first through hole 424 and in trench 426, using electroless deposition methods and materials that are known to a person of ordinary skill in the art. First Cu plug 442 and horizontal Cu interconnect line 444 are then selectively deposited, using electroless Cu deposition, on second metal layer 432 in first through hole 424 and in trench 426 respectively, see IC structure 440 illustrated in FIG. 4D. The novel electroless Cu deposition techniques of the present embodiment of the invention utilize electroless Cu deposition techniques described in the '223 patent, except that the present embodiment employs second metal layer 432 to initiate selective electroless Cu deposition while the '223 patent discloses the use of a Cu seed layer to initiate electroless Cu deposition. Second metal layer 432 comprising the second metal, provides a bottom Cu diffusion barrier layer for first Cu plug 442 and for Cu interconnect line 444. Preferably, first Cu plug 442 and Cu interconnect line 444 are deposited such that the respective cavities are slightly underfilled similar to first Cu plug 330 and Cu horizontal interconnect line 332 depicted in FIG. 3A.

Figure 4F:
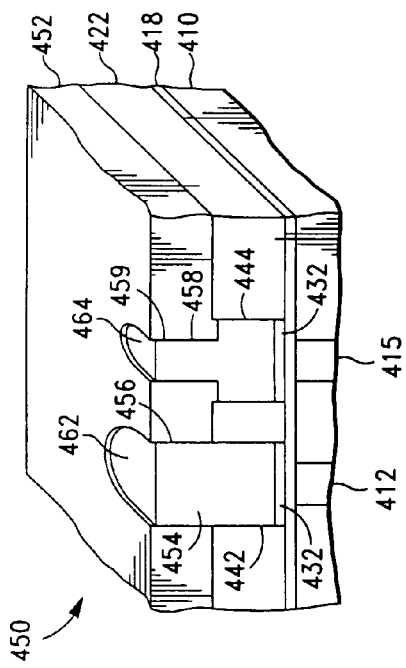

Subsequently, as shown in FIG. 4E depicting novel IC structure 450, a second sacrificial layer 452 is deposited on first sacrificial layer 422, first Cu plug 442 and Cu horizontal interconnect line 444. First and second sacrificial layers 422 and 452 comprise materials similar to materials that are used to form first and second sacrificial layers 122 and 138 described and illustrated in connection with FIGS. 1C-1E. Returning to FIG. 4E, a second Cu plug 454 is formed in second sacrificial layer 452 on first Cu plug 442, using a selective electroless Cu deposition technique similar to the technique that is employed for fabricating first Cu plug 442. The second Cu plug is in substantial alignment with the first Cu plug and such that second through hole 456, wherein the second Cu plug is formed, is preferably slightly underfilled. Similarly, a via 458 is fabricated in second sacrificial layer 452 on Cu interconnect line 444. Preferably, via 458 is fabricated such that via hole 459 is slightly underfilled. Structure 450 (FIG. 4E) includes a novel vertical interconnect 462 comprising second metal layer 432, first Cu plug 442 and second Cu plug 454. Structure 450 additionally includes a novel inverted damascene structure 464 comprising second metal layer 432, horizontal Cu interconnect line 444 and Cu via 458. IC structure 460, shown in FIG. 4F, depicts novel free standing vertical interconnect 462 and novel free standing inverted damascene structure 464 which are fabricated by removal of first and second sacrificial layers 422 and 452 shown in FIG. 4E. It is noted that removal of the first and second sacrificial layers results in exposed edges 466 of second metal layer 432, where these edges contacted the first sacrificial layer. As illustrated in FIG. 4F, free standing vertical interconnect 462 includes exposed top Cu surface 465 and exposed Cu extended surface 467 extending between top Cu surface 465 and second metal layer 432. Similarly, free standing inverted damascene structure 464 includes exposed top Cu surface 468 of via 458 and exposed Cu surface 469 extending between top Cu surface 468 and second metal layer 432. Each of the free standing structures illustrated in FIG. 4F thus includes an exposed Cu surface comprising (1) the exposed top Cu surface and (2) the Cu surface extending between the top Cu surface and the second metal layer.

Figure 4G:
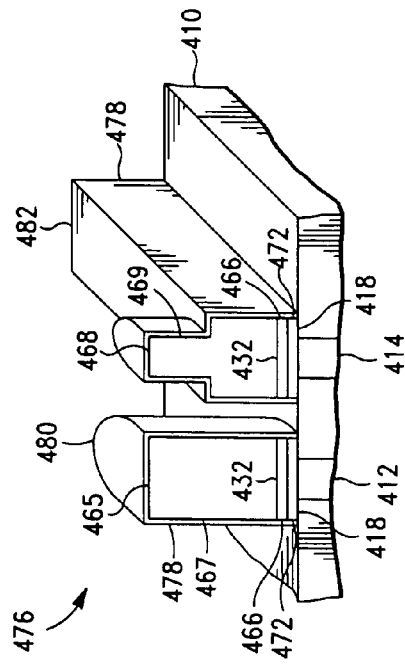
Figure 4H:
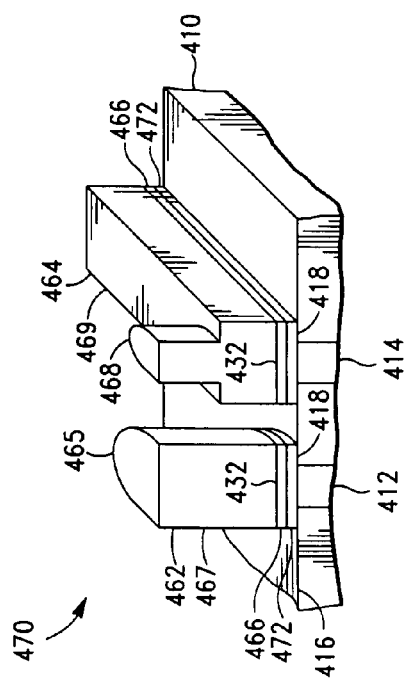
Figure 4I:
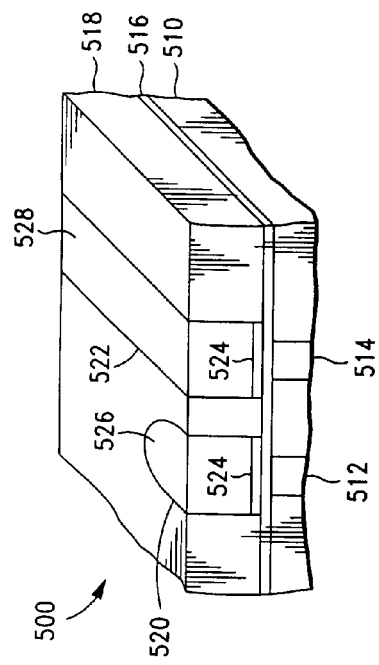

With reference to FIG. 4G, showing an IC structure 470, sensitizer layer 418 is removed from surface 416 of substrate 410 where layer 418 extends beyond vertical interconnect 462 and inverted damascene structure 464. Suitable removal techniques for removing sensitizer layer 418 include conventional etch back techniques and conventional electropolishing techniques which are known to a person of ordinary skill in the art. This technique results in exposed side edges 472 of sensitizer layer 418. As shown in FIG. 4H, depicting IC structure 476, a Cu diffusion barrier layer 478 is deposited on (1) top Cu surface 465, (2) Cu extended surface 467, (3) exposed edge 466 of second metal layer 432 and (4) exposed edge 472 of sensitizer layer 418. Similarly, Cu diffusion barrier layer 478 is deposited on (1) top Cu surface 468, (2) Cu extended surface 469, (3) exposed edge 466 of second metal layer 432 and (4) exposed edge 472 of sensitizer layer 418. The novel techniques of the present invention thereby result in a free standing vertical interconnect 480 (FIG. 4H) wherein Cu of the interconnect is completely encapsulated in Cu diffusion barrier layers comprising barrier layer 478 and second metal layer 432. Similarly, the novel techniques result in an inverted damascene structure 482 wherein Cu of the structure is completely encapsulated in Cu diffusion barrier layers comprising barrier layer 478 and second metal layer 432. Barrier layer 478 comprises materials similar to materials that are used to fabricate Cu diffusion barrier layer 160 described and illustrated in connection with FIGS. 1H-1K.

Subsequently, a dielectric material is deposited on the encapsulated structures to form a dielectric layer such that there are no voids between the encapsulated structures, employing techniques such as are described in connection with FIG. 1I. Conventional etch back or CMP is employed to fabricate novel IC structure 490, see FIG. 4I, including encapsulated vertical interconnect 480, inverted damascene structure 482 and dielectric layer 492.

In a further embodiment of the present invention, the novel techniques described and illustrated in connection with FIGS. 4A-4I can also be employed by completely filling cavities in the first and second sacrificial layers as described in connection with FIGS. 5A-5E. Novel IC structure 500, illustrated in FIG. 5A includes a substrate 510 having conductive elements 512 and 514, a sensitizer layer comprising a first metal layer 516 that is deposited on the substrate and on the conductive elements, and additionally a first sacrificial layer 518 fabricated on layer 516. First through hole 520 and trench 522 are formed in the sacrificial layer. A second metal layer 524 is fabricated in the bottom of the first through hole and in the bottom of the trench. It is noted that features 510, 512, 514, 516, 518, 520, 522 and 524 illustrated in FIG. 5 are similar to features 410, 412, 414, 418, 422, 424, 426 and 432 respectively depicted in FIG. 4D. Then, employing selective electroless Cu deposition methods and materials such as described in connection with first Cu plug 442 and vertical Cu interconnect line 444 (FIG. 4D), a first Cu plug 526 (FIG. 5A) and a horizontal Cu interconnect line 528 are deposited on second metal layer 524 in first through hole 520 and in trench 522. Electroless metal deposition techniques are employed such that first Cu plug 526 and Cu interconnect line 528 completely fill the respective cavities wherein they are formed.

Figure 5B:
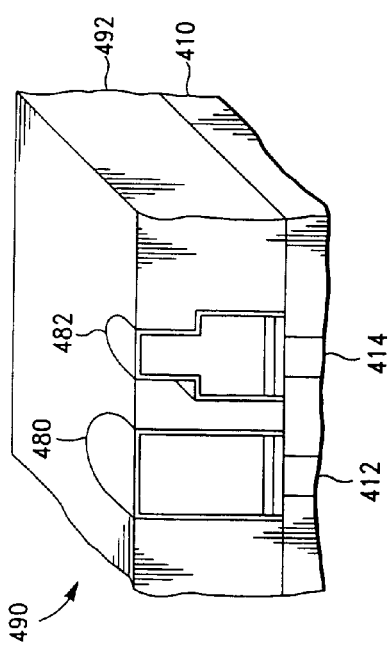
FIGS. 5A-5E are schematic cross-sectional perspective views illustrating an embodiment of IC structures of the present invention at sequential stages.
Figure 5A:
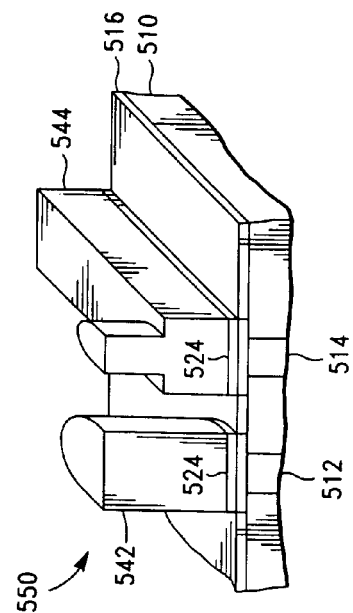

As illustrated in FIG. 5B, depicting novel IC structure 530, a second sacrificial layer 532 is deposited on first sacrificial layer 518, on first Cu plug 526 and on horizontal interconnect line 528. Thereafter a second through hole 534 and a via hole 536 are formed in the second sacrificial layer, wherein features 532, 534 and 536 illustrated in FIG. 5B, are similar to features 452, 456 and 460 respectively shown in FIG. 4E. A second Cu plug 538 (FIG. 5B) is fabricated in second through hole 534 while a Cu via 540 is fabricated in via hole 536. Second Cu plug 538 and Cu via 540 are fabricated using electroless deposition technique such as those employed for fabricating techniques such as those employed for fabricating first Cu plug 526 and horizontal Cu interconnect 528. The electroless Cu deposition techniques for fabricating second Cu plug 538 and Cu via 540 are such that Cu plug 538 and Cu via 540 completely fill the respective cavities wherein they are formed. IC structure 530, shown in FIG. 5B includes a vertical Cu interconnect 542 comprising second metal layer 524, first Cu plug 526 and second Cu plug 538. Additionally, IC structure 530 includes an inverted damascene structure 544 comprising second metal layer 524, horizontal Cu interconnect line 528 and Cu via 540.

Figure 5C:
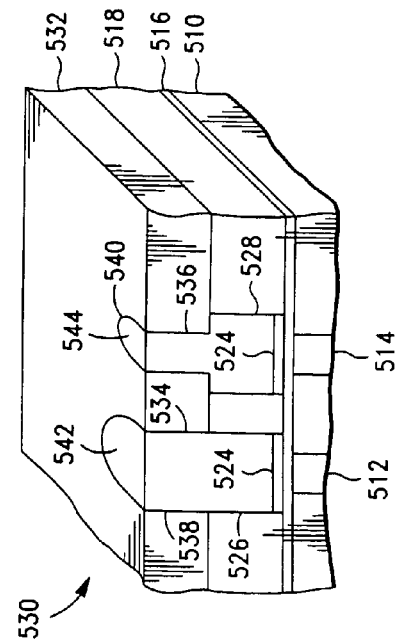
Figure 5E:
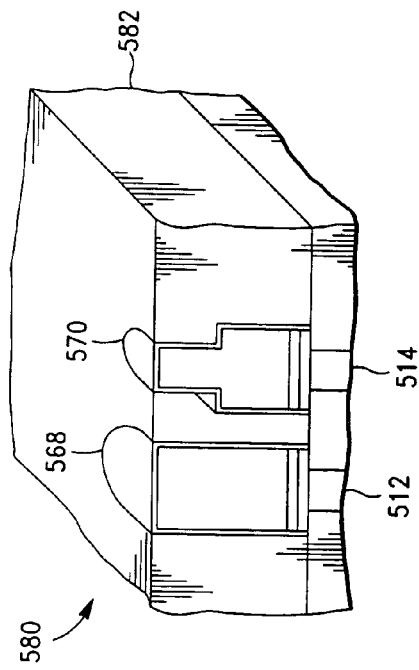
Figure 5D:
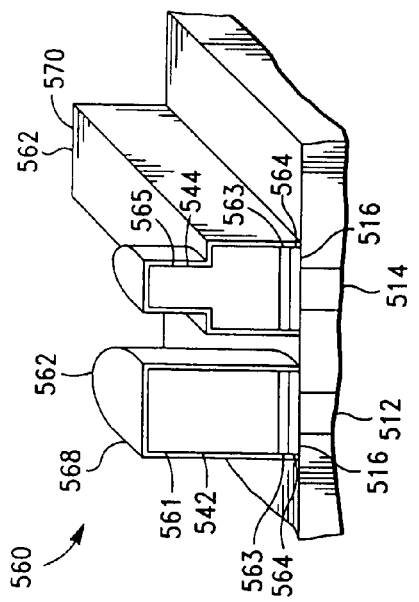

First and second sacrificial layers 518 and 532 are removed as shown in FIG. 5C depicting novel IC structure 550 including free standing vertical Cu interconnect 542 and inverted damascene structure 544. It is noted that free standing structures 542 and 544 shown in FIG. 5C are similar to free standing structure 462 and 464 depicted in FIG. 4F. Subsequently, sensitizer layer 516 is removed where this layer extends beyond structures 542 and 544, see FIG. 5D illustrating novel IC structure 560. Then, employing materials and methods of the present invention that are similar to those discussed in connection with IC structure 476 (FIG. 4H), a Cu diffusion barrier layer 562, see FIG. 5D, is deposited on exposed Cu surface 561 and exposed edge 563 of second metal layer 524 of vertical interconnect 542, as well as on exposed edge 564 of sensitizer layer 516. Similarly, Cu diffusion barrier layer 562 is deposited on exposed Cu surface 565 and exposed edge 563 of second metal layer 524 of inverted damascene structure, as well as on exposed edge 564 of sensitizer layer 516. As a result, IC structure 560 includes a free standing vertical Cu interconnect 568 wherein Cu is encapsulated in Cu diffusion barrier layers. Similarly, a free standing inverted damascene structure 570 is formed such that Cu is encapsulated in Cu diffusion barrier layers. Then, a dielectric material is deposited on the encapsulated structures as described in connection with IC structure 490 (FIG. 4I), resulting in IC structure 580, see FIG. 5E, including encapsulated vertical interconnect 568 and encapsulated inverted damascene structure 570 which are fabricated in dielectric layer 582.

Novel methods and IC structures of the present invention as illustrated and described in connection with FIGS. 1A-1K, 2A-2D, 3A-3E, 4A-4I and 5A-5E, employ at least two consecutive sacrificial layers to fabricate Cu components such as vertical interconnects and inverted damascene structures. The novel use of two or more consecutive sacrificial layers results in advantages exemplified as follows. Conventionally, the layer wherein a Cu component is formed is retained in the IC structure, the layer thus becomes an integral part of the final product. However, the novel technique employs a fabrication method wherein the Cu component is fabricated as a free standing structure having exposed top and side surfaces. This structure is then encased in a dielectric layer to form the final product. The novel technique thus improves IC design and manufacturing flexibility by allowing the use of a dielectric layer that is suitable for the final product, even if that particular dielectric layer is undesirable for forming the Cu component therein. Additionally, the novel technique as compared with conventional techniques, can result in a significant reduction in manufacturing costs since the novel process can be executed such that fewer manufacturing steps are required, particularly when the sacrificial layers comprise lithography definable materials such as photoresist.

Figure 6B:
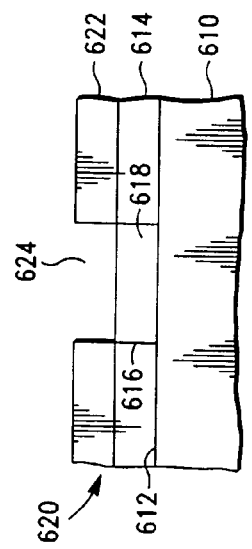
Figure 6A:
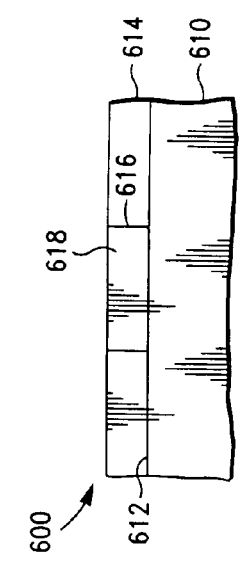

In additional embodiments of the present invention illustrated in FIGS. 6A-6F, IC structures are formed that facilitate etching or deposition in dielectric layer cavities having a relatively high aspect ratio. FIG. 6A shows an IC structure 600 comprising a semiconductor substrate 610 having a top surface 612. Substrate 610 is designed for fabricating a Cu interconnect component, such as a via, vertical interconnect or horizontal interconnect on the component, wherein the interconnect component has a height H1. As defined herein the term "height" means a dimension that is measured in a direction that is substantially perpendicular to the top surface of a substrate, such as top surface 612 of substrate 610. A first sacrificial layer 614 having a thickness T1, is deposited on top surface 612 of substrate 600, such that T1=½H1. As defined herein the term "thickness" means a layer dimension that is measured in a direction which is substantially perpendicular to the top surface of a substrate, such as top surface 612 of substrate 600. A first through hole 616 is formed in the first sacrificial layer, wherein the first through hole has a diameter D1. A first Cu layer 618 is selectively fabricated in through hole 616. The thickness of first Cu layer 618 is substantially equal to T1. The Cu layer thickness is thus substantially equal to ½H1.

As illustrated in FIG. 6B showing IC structure 620, a second sacrificial layer 622 is deposited on first sacrificial layer 616 and on Cu layer 618. The thickness T2 of second sacrificial layer 622 is substantially equal to ½H1, the total thickness T3 of the first and second sacrificial layers is thus substantially equal to H1. A second through hole 624 is prepared in second sacrificial layer 622 such that through hole 624 is aligned with through hole 616, wherein the second through hole has a diameter D2, such that D1 is substantially equal to D2. A second Cu layer 628 is deposited in second through hole 624, using ECP or electroless Cu deposition methods, as illustrated in FIG. 6C showing IC structure 626. Second Cu layer 628 has a thickness that is substantially equal to T2 and is thus substantially equal to ½H1. A Cu component 630, comprising first Cu layer 618 and second Cu layer 628, therefore has a thickness that is substantially equal to H1. First and second sacrificial layers 614 and 622 are then removed to form a free standing Cu component 630, see IC structure 632 shown in FIG. 6D.

First and second sacrificial layers 614 and 622 comprise compounds or materials similar to those described in connection with sacrificial layers 122 (FIG. 1A) and 138 (FIG. 1C), while ECP and electroless Cu deposition techniques concerning first and second Cu layers 618 (FIG. 6B) and 628 (FIG. 6C) are similar to the techniques described and illustrated in connection with FIGS. 1B and 3A respectively.

As illustrated in IC structure 636, depicted in FIG. 6E, Cu component 630 can be encapsulated in a Cu diffusion barrier layer 638, for example employing barrier layer materials that are described in connection with barrier layer 160 (FIG. 1H), forming an encapsulated free standing structure 640. The encapsulated structure can then be encased in a dielectric layer 646, thereby forming an IC structure 644 shown in FIG. 6F, comprising for example a metallic or intra metallic layer 648, wherein top surface 650 of component 640 is coplanar with top surface 652 of layer 648. The thickness of layer 648 can for example be substantially equal to H1. Dielectric methods and materials for deposition and forming of dielectric layer 646 can for example be similar to those that are described and illustrated in connection with dielectric layer 166 depicted in FIGS. 1I-1K.

According to embodiments of the present invention, the aspect ratio of first through hole 616 (FIG. 6A) is substantially equal to ½H1/D1. Similarly, the aspect ratio of second through hole 624 (FIG. 6B) is substantially equal to ½H1/D1. However, if a Cu component such as component 632 were fabricated by means of conventional techniques (not shown), i.e. by depositing Cu in a through hole having height H1 and diameter D1, the aspect ratio of the through hole would be substantially equal to H1/D1. The techniques of the present invention, as described and illustrated in connection with FIGS. 6A-6F, describe fabricating methods wherein Cu is deposited in two (aligned) consecutive cavities, such that each cavity is fabricated in a separate consecutive sacrificial layer. Each of the two novel cavities has an aspect ratio that is about half of the aspect ratio of a single cavity that would be used in conventional fabricating techniques. This novel technique thus facilitates etching and material deposition in cavities of the present invention, as compared with conventional techniques having a relative high aspect ratio.

It is noted that first and second sacrificial layers 614 and 622 (FIG. 6C) have substantially the same thickness. However, it is also contemplated to use first and second sacrificial layers wherein the thickness of the first sacrificial layer is not equal to the thickness of the second sacrificial layer, provided that the total thickness of the two layers is substantially equal to the desired height of the interconnect component that is to be fabricated in the two sacrificial layers. Furthermore, it is noted that a technique for underfilling the through holes, such as described in connection with FIGS. 1B and 1E, requires sacrificial layers that have a greater thickness in order to compensate for underfilling the through holes.

Employing the novel techniques of the present invention such as described and illustrated in connection with FIGS. 6A-6F, it is also contemplated to utilize a total of n sacrificial layers to fabricate a Cu component having a height H2 as illustrated in FIGS. 7A-7D. FIG. 7A shows an IC structure 700 comprising a semiconductor substrate 710, upon which is deposited a first sacrificial layer 712 having a through hole 714, wherein a first Cu layer 716 is deposited. Subsequently, a total of n−1 additional sacrificial layers comprising a dielectric stack 718, are sequentially deposited on first sacrificial layer 712, see FIG. 6A. IC structure 700 thus comprises a total of n sacrificial layers. Each sacrificial layer is deposited on a preceding sacrificial layer having a Cu layer in a through hole. The sacrificial layer is then developed to form a through hole that is aligned with the underlying Cu layer, similar to forming second sacrificial layer 622 on first sacrificial layer 614 that includes Cu layer 618 as shown in FIG. 6B. Returning to FIG. 7A, a Cu layer is then deposited in the through hole. As shown in FIG. 7A, the sequential n−1 through holes 720 include a total of n−1 sequential Cu layers 722 similar to Cu layer 716. IC structure 700 thus includes a total of n Cu layers wherein each of the n−1 Cu layers 722 is in substantial alignment with Cu layer 716 and wherein each of the n−1 Cu layers 722 is in electrical contact with Cu layer 716. The n Cu layers fabricated according to the novel techniques of the present invention form a Cu structure such as an interconnect component 724.

The n sacrificial layers, are then removed to form free standing Cu interconnect component 724 of IC structure 730 shown in FIG. 7B. With reference to FIG. 7C showing IC structure 740, a Cu diffusion barrier layer 742 is employed to encapsulate Cu component 724, thus forming an encapsulated free standing interconnect component 744. Free standing structure 744 can be encased in a dielectric layer 752 in IC structure 750 depicted in FIG. 7D. IC structure 750 can for example be formed in a dielectric layer such as a metallic layer or an intra metallic layer 752 such that the height of layer 752 is substantially equal to the height of encapsulated structure 744.

The techniques of the present invention as illustrated and described in connection with FIGS. 6A-6F and 7A-7D substantially reduce deposition difficulties in cavities having a high aspect ratio. Prior art technologies for forming an interconnect in a layer having a thickness TL, generally rely on depositing a conductor in a cavity in the layer such that the cavity extends throughout the thickness of the layer. The prior art cavity therefore has a height HC that is substantially equal to TL. However, embodiments of the present invention employ a number of sequential cavities that are sequentially filled with a conductor and wherein the height of each cavity is substantially lower than HC while having the same diameter as the prior art cavities. Consequently, each of the sequential cavities has a substantially lower aspect ratio than the prior art cavities.

Embodiments of the present invention, illustrated in FIGS. 6A-6F and 7A-7D, show sequential through holes having substantially similar diameters, thus resulting in sequential Cu layers having substantially similar diameters. However the present invention is equally operable where the sequential through holes do not have substantially similar diameters providing that the sequential Cu layers are aligned with, and in electrical contact with, the Cu layer that is deposited on the substrate.

FIG. 8 showing IC structure 800, illustrates an alternative embodiment of substrates of the present invention such as substrates 110 (FIG. 1A) and 610 (FIG. 6A). Returning to FIG. 8, a semiconductor substrate 810 is formed. A silicon oxide layer 812 is then deposited on substrate 810, utilizing for example well known TEOS (tetraethoxysilane) technology. Thereafter a layer 814 of BLOK™ is deposited on oxide layer 612. BLOK™ comprises a silicon-carbon-hydrogen based low-k dielectric barrier layer material that is typically deposited by PECVD (plasma enhanced chemical vapor deposition) using TMS (trimethylsilane) technology. BLOK™ is a trademark of Applied Materials, Inc. located in Santa Clara, Calif.

In alternative embodiment of the present invention, a silicon-based photosensitive material is utilized as disclosed in the U.S. Pat. No. 6,204,168 patent as follows. A first sacrificial layer comprising a silicon-based photosensitive material, such as PPMS (plasma polymerized methylsilane), such as layer 122 (FIG. 1A), is deposited on a substrate. The layer of PPMS is then exposed to UV light and developed according to a lithographic pattern to form a through hole and a trench similar to through hole 124 and trench 126 shown in FIG. 1A. The UV light exposure converts the PPMS material to PPMSO (plasma polymerized methylsilane oxide). Employing conventional ECP, a first Cu plug and Cu interconnect line such as plug 128 and interconnect line 130, depicted in FIG. 1B, are fabricated in the PPMSO through hole and trench. Subsequently, a second sacrificial layer such as layer 138 (FIG. 1C) comprising a conventional photoresist, for example a novolac based resist, is deposited on the surface of the PPMSO layer and on the surface of the Cu plug and the Cu interconnect line. The second photoresist layer is then developed to form a Cu deposition mask including a second through hole and a via hole such as second through hole 140 and via hole 142 (FIG. 1D), subsequently a second Cu plug and a Cu via such as second plug 146 and via 148 (FIG. 1E) are formed in the cavities.

The first and second sacrificial layers are then removed to form free standing structures such as vertical interconnect 154 and inverted damascene structure 156 depicted in FIG. 1F. Analogous with the fabrication of the structures shown in FIGS. 1G-1K, the fabrication process is continued to encapsulate the vertical interconnect and the inverted damascene structure in a barrier layer and subsequently in a dielectric layer, thereby forming an IC structure similar to IC structure 169 depicted in FIG. 1J.

It will be understood that substrates of the present invention such as substrates 110 (FIG. 1A) 410 (FIG. 4A) and 610 (FIG. 6A) include substrates that are exposed across substantially the entire surface of the wafer as well as substrates that are exposed by forming a cavity in one or more layers that are deposited in one or more previous wafer fabricating processing steps.

Embodiments of the present invention are exemplified by methods for forming inverted damascene structures comprising a via that is fabricated on a horizontal interconnect. However, it will be understood that methods of the present invention are equally operable where more than one via is fabricated on a horizontal interconnect.

Embodiments of the present invention, such as described and illustrated in connection with FIGS. 1A-1K, are exemplified by means of IC structures wherein each of these structures illustrates the fabrication of a vertical interconnect as well as an inverted damascene structure. It will be understood that the invention is equally operable when either a vertical interconnect or an inverted damascene structure is fabricated as the only type of interconnect structure employing the novel techniques of the present invention.

C-doped silicon oxide materials suitable for use in embodiments of the present invention include oxidized organo silane materials that are formed by partial oxidation of an organo silane compound, such that the dielectric material includes a carbon content of at least 1% by atomic weight, as described in U.S. Pat. No. 6,072,227 (Yau et al., 2000), U.S. Pat. No. 6,054,379 (Yau et al., 2000) and U.S. Pat. No. 6,593,247 (Huang et al., 2003). Commonly assigned U.S. Pat. Nos. 6,072,227, 6,054,379, and 6,593,247 are herein incorporated by reference in their entireties.

The oxidized organo silane materials, described in the '227, '379 and '247 patents, are formed by incomplete or partial oxidation of organo silane compounds generally including the structure:

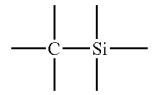

In this structure, —C— is included in an organo group and some C—Si bonds are not broken during oxidation. Preferably —C— is included in an alkyl, such as methyl or ethyl, or an aryl, such as phenyl. Suitable organo groups can also include alkenyl and cyclohexenyl groups and functional derivatives. Preferred organo silane compounds include the structure $SiH_a(CH_3)_b(C_2H_5)_c(C_6H_5)_d$, where a=1 to 3, b=0 to 3, c=0 to 3, d=0 to 3, and a+b+c+d=4, or the structure $Si_2H_e(CH_3)_f(C_2H_5)_g(C_6H_5)_h$, where e=1 to 5, f=0 to 5, g=0 to 5, h=0 to 5, and e+f+g+h=6.

Suitable organo groups include alkyl, alkenyl, cyclohexenyl, and aryl groups and functional derivatives. Examples of suitable organo silicon compounds include but are not limited to:

methylsilane $CH_3$—$SiH_3$
dimethylsilane $(CH_3)_2$—$SiH_2$
trimethylsilane $(CH_3)_3$—$SiH$
tetramethylsilane $(CH_3)_4$—$Si$
dimethylsilanediol $(CH_3)_2$—$Si(OH)_2$
ethylsilane $CH_3$—$CH_2$—$SiH_3$
phenylsilane $C_6H_5$—$SiH_3$
diphenylsilane $(C_6H_5)_2$—$SiH_2$
diphenylsilanediol $(C_6H_5)_2$—$Si$—$(OH)_2$
methylphenylsilane $C_6H_5$—$SiH_2$—$CH_3$
disilanomethane $SiH_3$—$CH_2$—$SiH_3$
bis(methylsilano)methane $CH_3$—$SiH_2$—$CH_2$—$SiH_2$—$CH_3$
1,2-disilanoethane $SiH_3$—$CH_2$—$CH_2$—$SiH_3$
1,2-bis(methylsilano)ethane $CH_3$—$SiH_2$—$CH_2$—$CH_2$—$SiH_2$—$CH_3$
2,2-disilanopropane $SiH_3$—$C(CH_3)_2$—$SiH_3$
1,3,5-trisilano-2,4,6-trimethylene —($SiH_2CH_2$—)$_3$— (cyclic)
dimethyldimethoxysilane $(CH_3)_2$—$Si$—$(OCH_3)_2$
diethyldiethoxysilane $(CH_3CH_2)_2$—$Si$—$(OCH_2CH_3)_2$
dimethyldiethoxysilane $(CH_3)_2$—$Si$—$(OCH_2CH_3)_2$
diethyldimethoxysilane $(CH_3CH_2)_2$—$Si$—$(OCH_2CH_3)_2$
1,3-dimethyldisiloxane $CH_3$—$SiH_2$—$O$—$SiH_2$—$CH_3$
1,1,3,3-tetramethyldisiloxane $(CH_3)_2$—$SiH$—$O$—$SiH$—$(CH_3)_2$
hexamethyldisiloxane $(CH_3)_3$—$Si$—$O$—$Si$—$(CH_3)_3$
1,3-bis(silanomethylene)disiloxane $(SiH_3$—$CH_2$—$SiH_2$—$)_2$—$O$
bis(1-methyldisiloxanyl)methane $(SiH_3$—$SiH_2$—$O$—$SiH_2$—$)_2$—$CH_2$
2,2-bis(1-methyldisiloxanyl)propane $(CH_3$—$SiH_2$—$O$—$SiH_2$—$)_2$—$O(CH_3)_2$
2,4,6,8-tetramethylcyclotetrasiloxane —($SiHCH_3$—$O$—)$_4$— (cyclic)
octamethylcyclotetrasiloxane —($Si(CH_3)_2$—$O$—)$_4$— (cyclic
2,4,6,8,10-pentamethylcyclopentasiloxane —($SiHCH_3$—$O$—)$_5$— (cyclic)
1,3,5,7-tetrasilano-2,6-dioxy-4,8,-dimethylene —($SiH_2$—$CH_2$—$SiH_2$—$O$—)$_2$— (cyclic)
2,4,6-trisilanetetrahydropyran —$SiH_2$—$CH_2$—$SiH_2$—$CH_2$—$SiH_2$—$O$— (cyclic)
2,5-disilanetetrahydrofuran —$SiH_2$—$CH_2$—$CH_2$—$SiH_2$—$O$— (cyclic) and fluorinated derivatives thereof.

Preferred organo silane compounds include but are not limited to: methylsilane; dimethylsilane; trimethylsilane; tetramethylsilane; dimethylsilanediol; diphenylsilane; diphenylsilanediol; methylphenylsilane; bis(methylsilano) methane; 1,2-bis(methylsilano)ethane; 1,3,5-trisilano-2,4,6-trimethylene; dimethyldimethoxysilane; diethyldiethoxysilane; dimethyldiethoxysilane; diethyldimethoxysilane; hexamethyldisiloxane; octamethylcyclotetrasiloxane; and fluorinated derivatives thereof. The most preferred organo silane compounds include methyl silane and trimethyl silane.

The organo silane compounds are oxidized during deposition by reaction with oxygen ($O_2$) or oxygen containing compounds such as nitrous oxide ($N_2O$) and hydrogen peroxide ($H_2O_2$), such that the carbon content of the deposited film is from 1% to 50% by atomic weight, preferably about 20%. The oxidized organo silane layer has a dielectric constant of about 3.0. Carbon, including some organo functional groups, remaining in the oxidized organo layer contributes to low dielectric constants and good barrier properties providing a barrier that inhibits for example diffusion of moisture or metallic components. These oxidized organo silane materials exhibit good adhesion properties to silicon oxide and silicate glass as well as typical dielectric materials employed in IC structures. The above described oxidized organo silanes include BLACK DIAMOND™ technology, available from Applied Materials, Inc. located in Santa Clara, Calif.

Plasma conditions for depositing a layer of the oxidized organo silane material having a carbon content of at least 1% by atomic weight, include a high frequency RF power density from about at least 0.16 W/cm$^2$ and a sufficient amount of organo silane compound with respect to the oxidizing gas to provide a layer with carbon content of at least 1% by atomic weight. When oxidizing organo silane materials with $N_2O$, a preferred high frequency RF power density ranges from about 0.16 W/cm$^2$ to about 0.48 W/cm$^2$.

These conditions are particularly suitable for oxidizing $CH_3$—$SiH_3$ with $N_2O$. Oxidation of organo silane materials such as $(CH_3)_3$—$SiH$ with $O_2$ is preferably performed at a high frequency RF power density of at least 0.3 W/cm$^2$, preferably ranging from about 0.9 W/cm$^2$ to about 3.2 W/cm$^2$. Suitable reactors for depositing this material include parallel plate reactors such as those described in the '379 and '227 patents. As shown in the '227, '379 and '247 patents, the oxidized organo silane materials including at least 1% of carbon can be utilized in multi-layered structures such as are used, for example, in fabricating integrated circuit structures.

Embodiments of the present invention are described and illustrated using Cu to fabricate exemplary interconnects, plugs, vias and inverted damascene structures. However, it is also contemplated to employ metals other than Cu, for example employing metals such as Cu alloys, Al and Al alloys instead of Cu.

The invention has been described in terms of exemplary embodiments of the invention. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

We claim:

1. A method of forming an IC structure on a semiconductor substrate, the method comprising:
   a) depositing a first Cu diffusion barrier layer on the substrate, wherein the first Cu diffusion barrier layer comprises an electrically conductive Cu diffusion barrier layer;
   b) depositing an electrically conductive Cu seed layer on the first Cu diffusion barrier layer, such that the first Cu diffusion barrier layer and the Cu seed layer form a sandwich layer;
   c) depositing a first sacrificial layer on the sandwich layer;
   d) selectively developing the first sacrificial layer to form a first cavity extending through the first sacrificial layer to the sandwich layer;
   e) depositing a first Cu layer in the first cavity wherein the first Cu layer includes an exposed first Cu top surface, and wherein the first Cu layer includes a horizontal interconnect
   f) depositing a second sacrificial layer on the first sacrificial layer and on the first Cu top surface;
   g) developing the second sacrificial layer to form a second cavity extending through the second sacrificial layer and exposing at least a portion of the first Cu top surface;

h) selectively depositing a second Cu layer in the second cavity including the exposed portion of the first Cu top surface, wherein the second Cu layer includes an exposed second Cu top surface and a via;

i) removing the first and second sacrificial layers thereby forming a first Cu component comprising (1) the first and second Cu layers, (2) the exposed second Cu top surface and (3) an exposed extended Cu surface that extends between the second Cu top surface and the sandwich layer, and (4) an inverted damascene structure.

2. The inverted damascene structure fabricated according to the method of claim 1.

3. The method of claim 1 additionally comprising:

a) removing substantially all of the sandwich layer that extends from the first Cu component on the substrate, thereby forming an exposed sandwich layer edge;

b) depositing a second Cu diffusion barrier layer on (1) the exposed second Cu top surface, (2) the exposed extended Cu surface and (3) the exposed sandwich layer edge, thereby forming a barrier layer encapsulated component having a top barrier layer coated surface;

c) depositing a dielectric layer on the barrier layer encapsulated component; and d) forming the dielectric layer such that the dielectric layer includes a top surface that is substantially coplanar with the top barrier layer coated surface of the encapsulated component, thereby forming a dielectric layer encased IC structure.

4. The method of claim 3 wherein the second Cu barrier layer comprises CoWP.

5. The dielectric layer encased structure fabricated according to the method of claim 3.

6. The method of claim 1 additionally comprising the first sacrificial layer including a first lithography definable material that is capable of forming a three dimensional IC fabrication pattern upon exposure to radiation selected from the group consisting of light, x-rays and electron-beam.

7. The method of claim 6 additionally comprising the second sacrificial layer including a second lithography definable material that is capable of forming a three dimensional IC fabrication pattern upon exposure to radiation selected from the group consisting of light, x-rays and electron-beam.

8. The method of claim 1 wherein the first and second sacrificial layers comprise one or more materials selected from the group consisting of lithography definable materials (materials that are capable of forming a three dimensional IC fabrication pattern upon exposure to radiation selected from the group consisting of light, x-ray and electronic-beam), sacrificial light absorbing materials, inorganic dielectric materials and organic dielectric materials.

9. The method of claim 8 wherein the lithography definable materials include photoresist materials.

10. The method of claim 8 wherein the lithography definable materials include plasma polymerized methylsilane that, upon exposure to UV light, is converted to plasma polymerized methylsilane oxide.

11. The method of claim 1 wherein depositing the first and second Cu layers comprises employing electrochemical Cu plating.

12. The method of claim 1 wherein depositing the first and second Cu layers comprises employing electroless Cu deposition.

13. A method of forming an IC structure on a semiconductor substrate, the method comprising:

a) Selectively depositing a sensitizer layer on the substrate, wherein the sensitizer layer comprises a first metal layer;

b) depositing a first sacrificial layer on the sensitizer layer;

c) developing the first sacrificial layer to form a first cavity extending through the first sacrificial layer;

d) selectively depositing a second metal layer on the sensitizer layer in the first cavity;

e) employing electroless Cu deposition, selectively depositing a first Cu layer on the second metal layer in the first cavity, wherein the first Cu layer includes an exposed first Cu top surface;

f) depositing a second sacrificial layer on the first sacrificial layer and on the first Cu top surface;

g) developing the second sacrificial layer to form a second cavity extending through the second sacrificial layer and exposing at least a portion of the first Cu top surface;

h) employing electroless Cu deposition, selectively depositing a second Cu layer in the second cavity including the exposed portion of the first Cu top surface, wherein the second Cu layer includes an exposed second Cu top surface; and i) removing the first and second sacrificial layers thereby forming a first Cu component comprising (1) the first and second Cu layers, (2) the exposed second Cu top surface and (3) an exposed extended Cu surface that extends between the second Cu top surface and the sensitizer layer, wherein (1) the first Cu layer includes a horizontal interconnect and (2) the second Cu layer includes a via, and wherein the first Cu component comprises an inverted damascene structure.

14. The method of claim 13 additionally comprising:

a) removing substantially all of the sensitizer layer that extends from the first Cu component on the substrate, thereby forming an exposed sensitizer layer edge;

b) depositing a Cu diffusion barrier layer on (1) the exposed second Cu top surface, (2) the exposed extended Cu surface and (3) the exposed sensitizer layer edge, thereby forming a Cu diffusion barrier layer coated component having a barrier layer coated top surface;

c) depositing a dielectric layer on the barrier layer coated component; and d) forming the dielectric layer such that the dielectric layer includes a dielectric top surface that is substantially coplanar with the barrier layer coated top surface, thereby forming a dielectric layer encased IC structure.

15. The method of claim 14 wherein the Cu barrier layer comprises CoWP.

16. The dielectric layer encased structure fabricated according to the method of claim 14.

17. The method of claim 14 wherein the first and second sacrificial layers comprise one or more materials selected from the group consisting of lithography definable materials (materials that are capable of forming a three dimensional IC fabrication pattern upon exposure to radiation selected from the group consisting of light, x-ray and electronic-beam), sacrificial light absorbing materials, inorganic dielectric materials and organic dielectric materials.

18. The method of claim 17 wherein the lithography definable materials include photoresist materials.

19. The method of claim 13 wherein the first Cu layer is deposited in the first cavity such that the first cavity is underfilled.

20. The method of claim 13 wherein the sensitizer layer comprises one or more metals selected from the group consisting of Pd, Pt, Ru, Rh, Os, Ir and Sn.

21. The method of claim 20 wherein the second metal layer comprises metals selected from the group consisting of Ni and Co.

22. A method of forming an IC structure on a semiconductor substrate wherein the IC structure includes a Cu component having a height H1, the method comprising:
  a) depositing a first sacrificial layer on a substrate wherein the first sacrificial layer includes a thickness T1 such that T1<H1;
  b) developing the first sacrificial layer to from a first cavity extending to the substrate;
  c) depositing a first Cu layer in the first cavity, wherein the first Cu layer includes a first Cu top surface;
  d) depositing a second sacrificial layer on the first sacrificial layer and on the first Cu top surface, such that the second sacrificial layer includes a thickness T2 such that T1+T2=H2, wherein H2 is at least substantially equal to H1;
  e) developing the second sacrificial layer to form a second cavity extending through the second sacrificial layer and exposing at least a portion of the first Cu top surface; and
  f) depositing a second Cu layer in the second cavity including the portion of the first Cu top surface, such that a combined thickness T3 of the first Cu layer and the second Cu layer that is deposited on the portion of the first dialectric layer, is substantially equal to height H1, thereby forming a Cu component including the first and second Cu layers and having a height that is substantially equal to height H1.

23. The method of claim 22, additionally comprising removing the first and second sacrificial layers, thereby forming an exposed Cu component having (1) an exposed component top surface (2) an exposed extended Cu surface extending between the component top surface and the substrate and (3) a height that is substantially equal to H1.

24. The exposed Cu component fabricated according to the method of claim 23.

25. The method of claim 22 wherein T1 is substantially equal to ½H1.

26. The method of claim 22 wherein the Cu component comprises a component selected from the group of horizontal interconnects and vias.

27. The method of claim 22 wherein the first and second sacrificial layers comprise one or more materials selected from the group consisting of lithography definable materials (materials that are capable of forming a three dimensional IC fabrication pattern upon exposure to radiation selected from the group consisting of light, x-ray and electronic-beam), sacrificial light absorbing materials, inorganic dielectric materials and organic dielectric materials.

28. The method of claim 23 additionally comprising:
  a) encapsulating the exposed Cu component in a Cu diffusion barrier layer, thereby forming an encapsulated component; and
  b) encasing the encapsulated component in a dielectric layer.

29. A method of forming an IC structure on a semiconductor substrate wherein the IC structure includes a Cu component having a height H1, the method comprising:
  a) depositing a first sacrificial layer on a substrate wherein the first sacrificial layer includes a thickness T1 such that T1<H1;
  b) developing the first sacrificial layer to form a first cavity extending to the substrate;
  c) depositing a first Cu layer in the first cavity wherein the first Cu layer includes an exposed Cu top surface;
  d) sequentially fabricating a total of n−1 sacrificial layers, having a total thickness T2 such that T1+T2 is at least equal to H, on the first sacrificial layer such that each of the n−1 sacrificial layers includes a Cu component therein, thus having a total of n−1 Cu components, wherein each Cu component (1) is in substantial alignment with the first Cu layer and (2) in electrical contact with the first Cu layer, and wherein n is at least 3;
  e) removing the first sacrificial layer and the n−1 sacrificial layers, thereby forming an exposed Cu structure including the first Cu layer and the n−1 Cu components, such that the exposed Cu structure includes a height which is substantially equal to H1;
  f) encapsulating the exposed Cu structure in a Cu diffusion barrier layer thereby forming an encapsulated Cu structure; and
  g) encasing the encapsulated structure in a dielectric layer.

30. The method of claim 29 wherein the first sacrificial layer and the n−1 sacrificial layers comprise one or more materials selected from the group consisting of lithography definable materials.

31. The structure fabricated according to the method of claim 29.

* * * * *